(12) United States Patent
Mihara

(10) Patent No.: US 9,608,091 B2
(45) Date of Patent: Mar. 28, 2017

(54) METHOD FOR MANUFACTURING A SEMICONDUCTOR DEVICE

(71) Applicant: RENESAS ELECTRONICS CORPORATION, Tokyo (JP)

(72) Inventor: Tatsuyoshi Mihara, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/921,445

(22) Filed: Oct. 23, 2015

(65) Prior Publication Data

US 2016/0043200 A1 Feb. 11, 2016

Related U.S. Application Data

(63) Continuation of application No. 14/466,092, filed on Aug. 22, 2014, now Pat. No. 9,214,570, which is a
(Continued)

(30) Foreign Application Priority Data

Sep. 4, 2012 (JP) ................................. 2012-194420

(51) Int. Cl.
*H01L 21/336* (2006.01)
*H01L 29/66* (2006.01)
(Continued)

(52) U.S. Cl.
CPC .... *H01L 29/66833* (2013.01); *G11C 11/5671* (2013.01); *G11C 16/0475* (2013.01);
(Continued)

(58) Field of Classification Search
CPC .............................................. H01L 21/823468
(Continued)

(56) References Cited

U.S. PATENT DOCUMENTS 6,509,593 B2 1/2003 Inoue et al.
6,569,742 B1 5/2003 Taniguchi et al.
(Continued)

FOREIGN PATENT DOCUMENTS

JP 2000-252422 A 9/2000
JP 2009-253037 A 10/2009
(Continued)

OTHER PUBLICATIONS

Japanese Office Action received in corresponding Japanese Application No. 2012-194420 dated Oct. 27, 2015.
(Continued)

*Primary Examiner* — Chandra Chaudhari
(74) *Attorney, Agent, or Firm* — Mattingly & Malur, PC

(57) ABSTRACT

The improvement of the reliability of a semiconductor device having a split gate type MONOS memory is implemented. An ONO film and a second polysilicon film are sequentially formed so as to fill between a first polysilicon film and a dummy gate electrode. Then, the dummy gate electrode is removed. Then, the top surfaces of the first and second polysilicon films are polished, thereby to form a memory gate electrode formed of the second polysilicon film at the sidewall of a control gate electrode formed of the first polysilicon film via the ONO film. As a result, the memory gate electrode high in perpendicularity of the sidewall, and uniform in film thickness is formed.

5 Claims, 32 Drawing Sheets

Related U.S. Application Data continuation of application No. 13/964,576, filed on Aug. 12, 2013, now Pat. No. 8,846,471.

(51) Int. Cl.
| | | |
|---|---|---|
| *H01L 29/423* | (2006.01) | |
| *H01L 29/792* | (2006.01) | |
| *H01L 27/11568* | (2017.01) | |
| *G11C 11/56* | (2006.01) | |
| *G11C 16/04* | (2006.01) | |
| *H01L 27/11* | (2006.01) | |
| *H01L 27/06* | (2006.01) | |
| *H01L 21/8234* | (2006.01) | |

(52) U.S. Cl.
CPC .... *H01L 27/1104* (2013.01); *H01L 27/11568* (2013.01); *H01L 29/4234* (2013.01); *H01L 29/792* (2013.01); *H01L 21/823468* (2013.01); *H01L 27/0629* (2013.01); *H01L 29/66545* (2013.01)

(58) Field of Classification Search
USPC .................................................. 438/267, 596
See application file for complete search history.

(56) References Cited

U.S. PATENT DOCUMENTS

| | | | |
|---|---|---|---|
| 6,579,764 | B2 | 6/2003 | Kuwazawa |
| 7,935,597 | B2 | 5/2011 | Shimamoto et al. |
| 7,943,495 | B2 * | 5/2011 | Jeong ................ H01L 21/28282 438/954 |
| 8,212,309 | B2 | 7/2012 | Tsuji |
| 2008/0121974 | A1 | 5/2008 | Steimle et al. |

FOREIGN PATENT DOCUMENTS

| | | |
|---|---|---|
| JP | 2009-302269 A | 12/2009 |
| WO | 2009/104688 A1 | 8/2009 |

OTHER PUBLICATIONS

Taiwanese Office Action received in corresponding Taiwanese Application No. 102129182 dated Jan. 12, 2017.

Japanese Office Action received in corresponding Japanese Application No. 2016-095536 dated Feb. 14, 2017.

* cited by examiner

METHOD FOR MANUFACTURING A SEMICONDUCTOR DEVICE

CROSS-REFERENCE TO RELATED APPLICATIONS

This application is a continuation of U.S. patent application Ser. No. 14/466,092, filed Aug. 22, 2014, which is a continuation of U.S. patent application Ser. No. 13/964,576, filed Aug. 12, 2013, now U.S. Pat. No. 8,846,471, issued Sep. 30, 2014 which claims priority to Japanese Patent Application No. 2012-194420, filed Sep. 4, 2012, the disclosure of which, including the specification, drawings and abstract, is incorporated herein by reference in its entirety.

BACKGROUND

The present invention relates to a method for manufacturing a semiconductor device. More particularly, it relates to a technology effectively applicable to a semiconductor device having a split gate type nonvolatile memory.

As one of nonvolatile memories, there is known a MONOS (Metal Oxide Nitride Oxide Semiconductor) memory having a structure of FET (Field Effect Transistor), and accumulating electric charges at an ONO (Oxide Nitride Oxide) film formed between a gate electrode and a substrate, and thereby storing information. Further, MONOS memories include a split gate type nonvolatile memory having a selection gate electrode to be used for selecting a memory cell, and a memory gate electrode formed adjacent to the selection gate via an insulation film, and to be used for storing information.

Patent Document 1 (WO2009/104688) describes that, in a step of forming a split gate type nonvolatile memory element, a semiconductor layer forming a memory gate electrode is embedded in an opening of a pattern forming a control gate electrode. However, herein, it is not described that a dummy gate electrode (a sacrifice pattern not to be left in a finished semiconductor device) is formed. Further, there is no description on a capacitive element.

Patent Document 2 (Japanese Unexamined Patent Publication No. 2009-302269) describes the following: in order to prevent the ONO film from being damaged by ion implantation due to the reduction of each height of the selection gate electrode and the memory gate electrode, the ONO film and the memory gate electrode are formed after the formation of source/drain regions.

PATENT DOCUMENTS

Patent Document 1 WO2009/104688
Patent Document 2 Japanese Unexamined Patent Publication No. 2009-302269

SUMMARY

For miniaturization of a semiconductor device, it can be considered that, in a split gate type MONOS memory cell, the heights of the selection gate electrode and the memory gate electrode are reduced. However, in this case, it becomes difficult to ensure the shape required for the memory gate electrode, unfavorably, resulting in the degradation of the characteristics and the reliability of the semiconductor device.

Other objects and novel features will be apparent from the description of this specification and the accompanying drawings.

Summaries of the representative ones of the inventions disclosed in the present invention will be described in brief as follows.

In a semiconductor device which is one embodiment, a pattern of a second polysilicon film is formed between a first polysilicon film and a dummy gate electrode via an ONO film, then, the dummy gate electrode is removed, resulting in the formation of a memory gate electrode high in perpendicularity of the sidewall thereof, and uniform in film thickness at the sidewall of a control gate electrode via the ONO film.

In accordance with one embodiment disclosed in the present invention, it is possible to improve the reliability of the semiconductor device.

DETAILED DESCRIPTION

Figure 1:
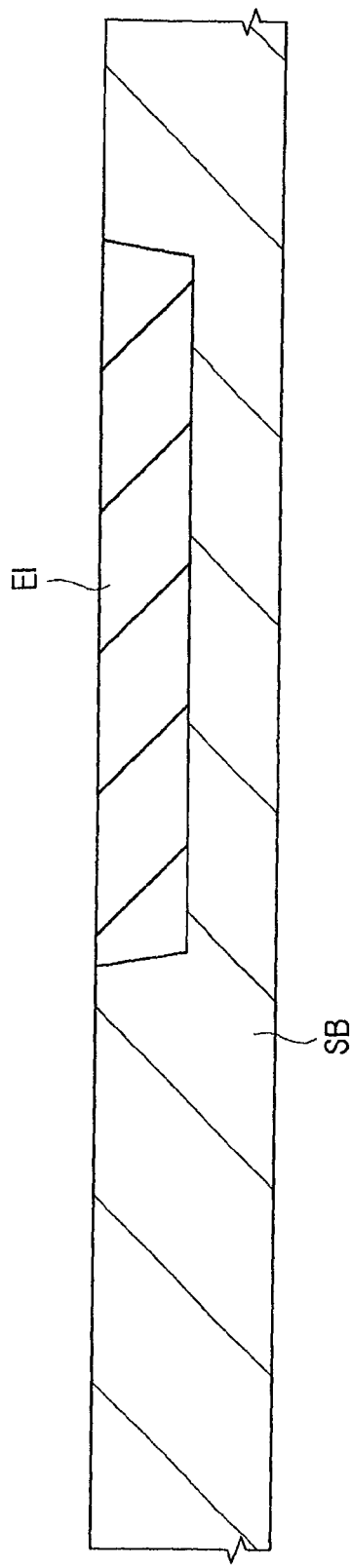
FIG. 1 is a cross-sectional view showing a method for manufacturing a semiconductor device which is First Embodiment of the present invention.

Below, embodiments will be described in details by reference to the accompanying drawings. Incidentally, throughout all the drawings for describing the embodiments, the members having the same function are given the same reference numerals and signs, and a description thereon will not be repeated. Further, in the following embodiments, a description on the same or similar portions will not be repeated unless particularly required.

Further, in the drawings for use in the following embodiments, even a plan view may be partially hatched for easy understanding of the drawings.

First Embodiment

With a semiconductor device of the present embodiment, a MONOS memory cell which is a split gate type nonvolatile memory cell formed over a semiconductor substrate is miniaturized, and the reliability of the semiconductor device is improved.

Below, a method for manufacturing a semiconductor device of the present embodiment will be described by reference to FIGS. 1 to 26. FIGS. 1 to 5, 7, 8, 11 to 15, 17 to 23, and 26 are each a cross-sectional view for illustrating a manufacturing step of the semiconductor device of the present embodiment. In FIGS. 2 to 5, 7, 8, 11 to 15, 17 to 23, and 26, there are shown a MONOS memory formation region A1, a feeding part formation region B1, a capacitive element formation region C1, and a low breakdown voltage element formation region D1 sequentially from the left-hand side of each figure.

Further, FIGS. 6, 9, 16, and 25 each show a plane layout of the capacitive element formation region of the semiconductor device during a manufacturing step. Whereas, FIGS. 10 and 24 each show a plane layout of the feeding part formation region of the semiconductor device during a manufacturing step.

First, as shown in FIG. 1, for example, there is provided a semiconductor substrate SB formed of single crystal silicon. Subsequently, a trench is formed in the main surface of the semiconductor substrate SB. A silicon oxide film or the like is embedded in the trench, thereby to form an element isolation region EI. The element isolation region EI is assumed to result from, for example, STI (Shallow Trench Isolation). Then, impurities are implanted into the main surface of the semiconductor substrate SB by an ion implantation method, or the like, thereby to form a well (not shown). The depth to which the well is formed is assumed to be deeper than that of the element isolation region EI.

Figure 2:
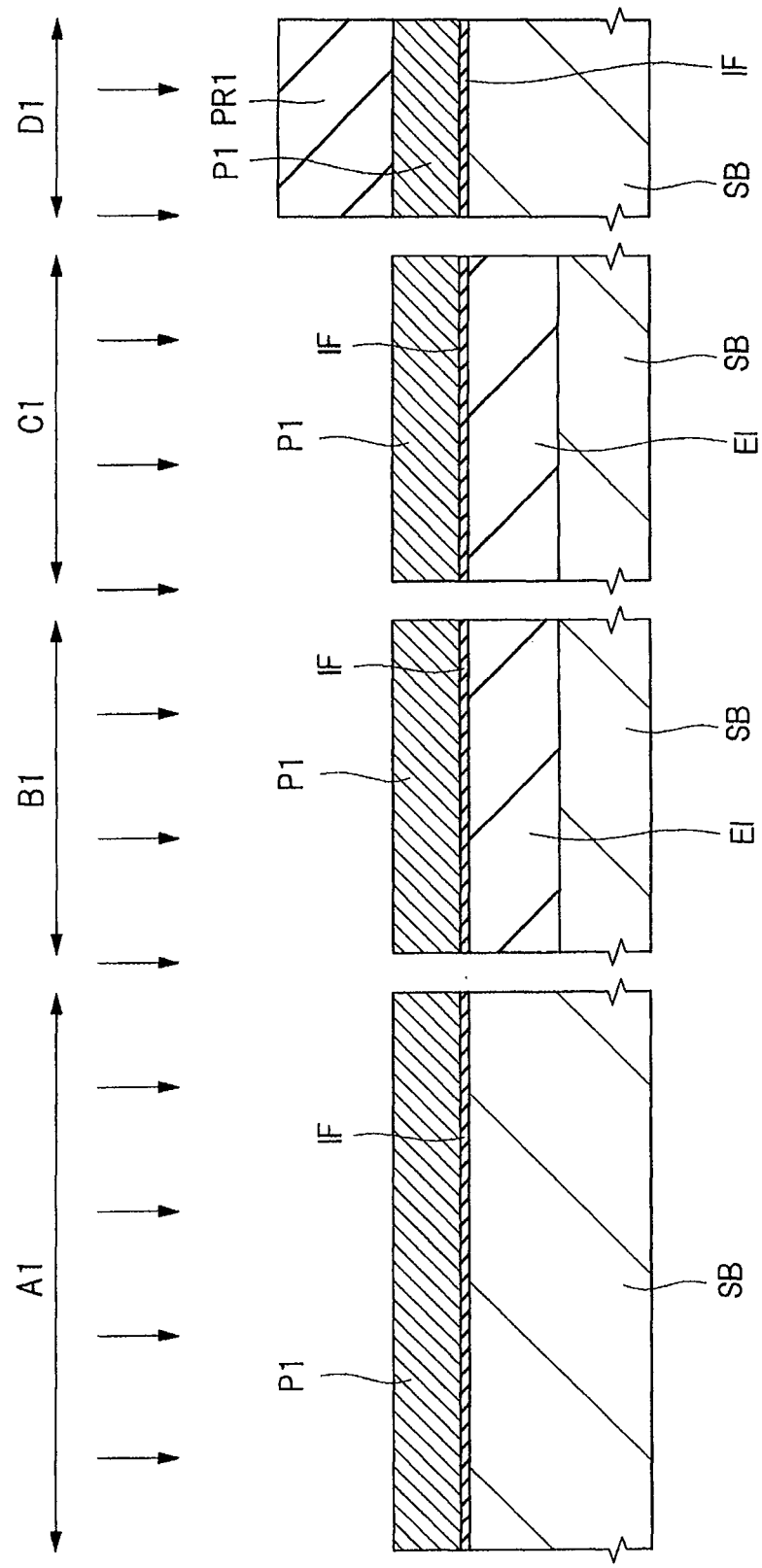
FIG. 2 is a cross-sectional view showing a method for manufacturing the semiconductor device following FIG. 1.

Then, as shown in FIG. 2, over the main surface of the semiconductor substrate SB, there are sequentially formed an insulation film IF and a polysilicon film P1. The insulation film IF is formed of, for example, a silicon oxide film. The insulation film IF and the polysilicon film P1 are formed by, for example, a CVD (Chemical Vapor Deposition) method. Then, using a photolithography technology, N type impurities (e.g., As (arsenic)) are implanted into apart of the polysilicon film P1 by the ion implantation method. Herein, with the top of the polysilicon film P1 in the low breakdown voltage element formation region D1 covered with a photoresist PR1, ion implantation is performed. As a result, impurity ions are implanted into the polysilicon film P1 in the MONOS memory formation region A1, the feeding part formation region B1, and the capacitive element formation region C1.

Incidentally, the MONOS memory formation region A1 and the low breakdown voltage element formation region D1 shown in FIG. 2 are each a region in which the element isolation region EI was not formed in the step described by reference to FIG. 1, namely, an active region in which the main surface of the semiconductor substrate SB is exposed from the element isolation region EI. Whereas, the feeding part formation region B1 and the capacitive element formation region C1 are each a region in which the element isolation region EI was formed in the step described by reference to FIG. 1.

Figure 3:
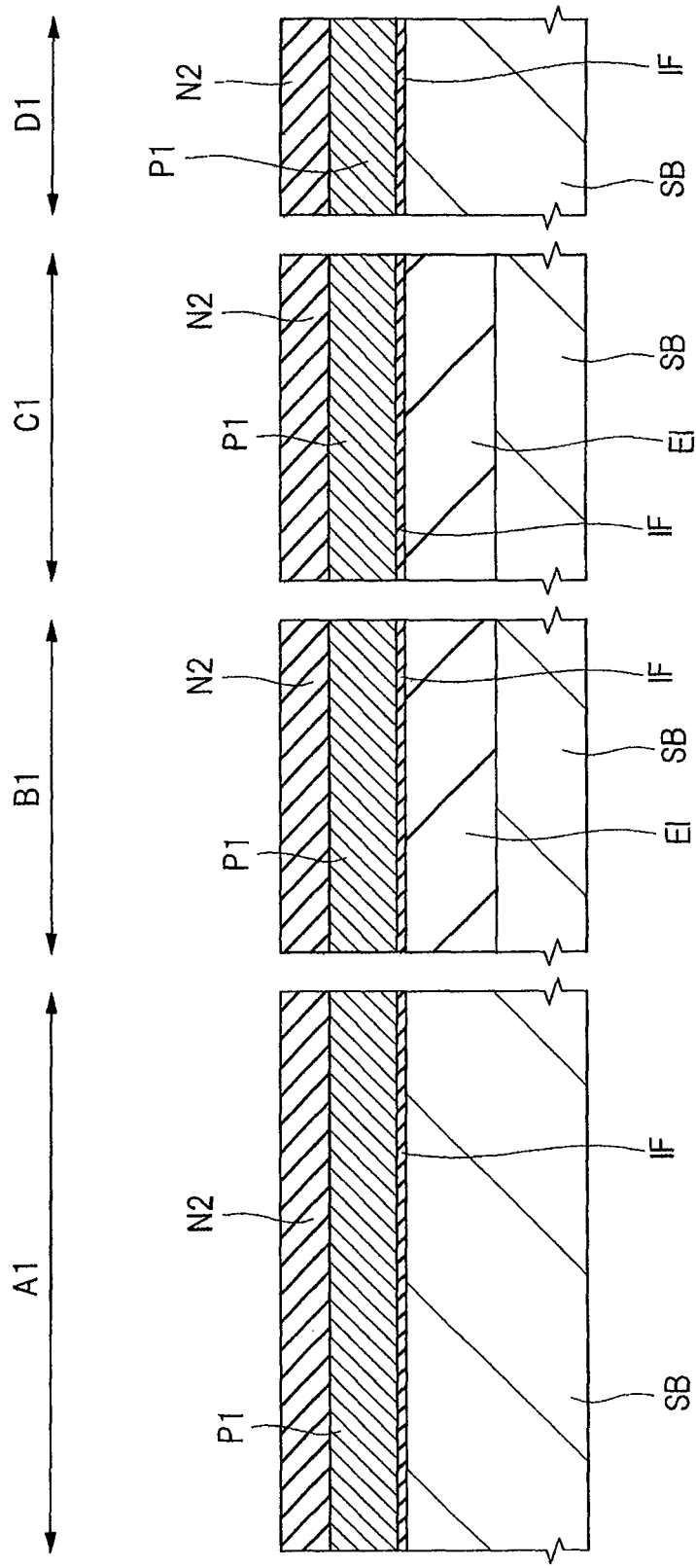
FIG. 3 is a cross-sectional view showing a method for manufacturing the semiconductor device following FIG. 2.

Then, as shown in FIG. 3, after removing the photoresist film PR1, a silicon nitride film N2 is formed (deposited) entirely over the top surface of the polysilicon film. P1 using a CVD method or the like.

Figure 4:
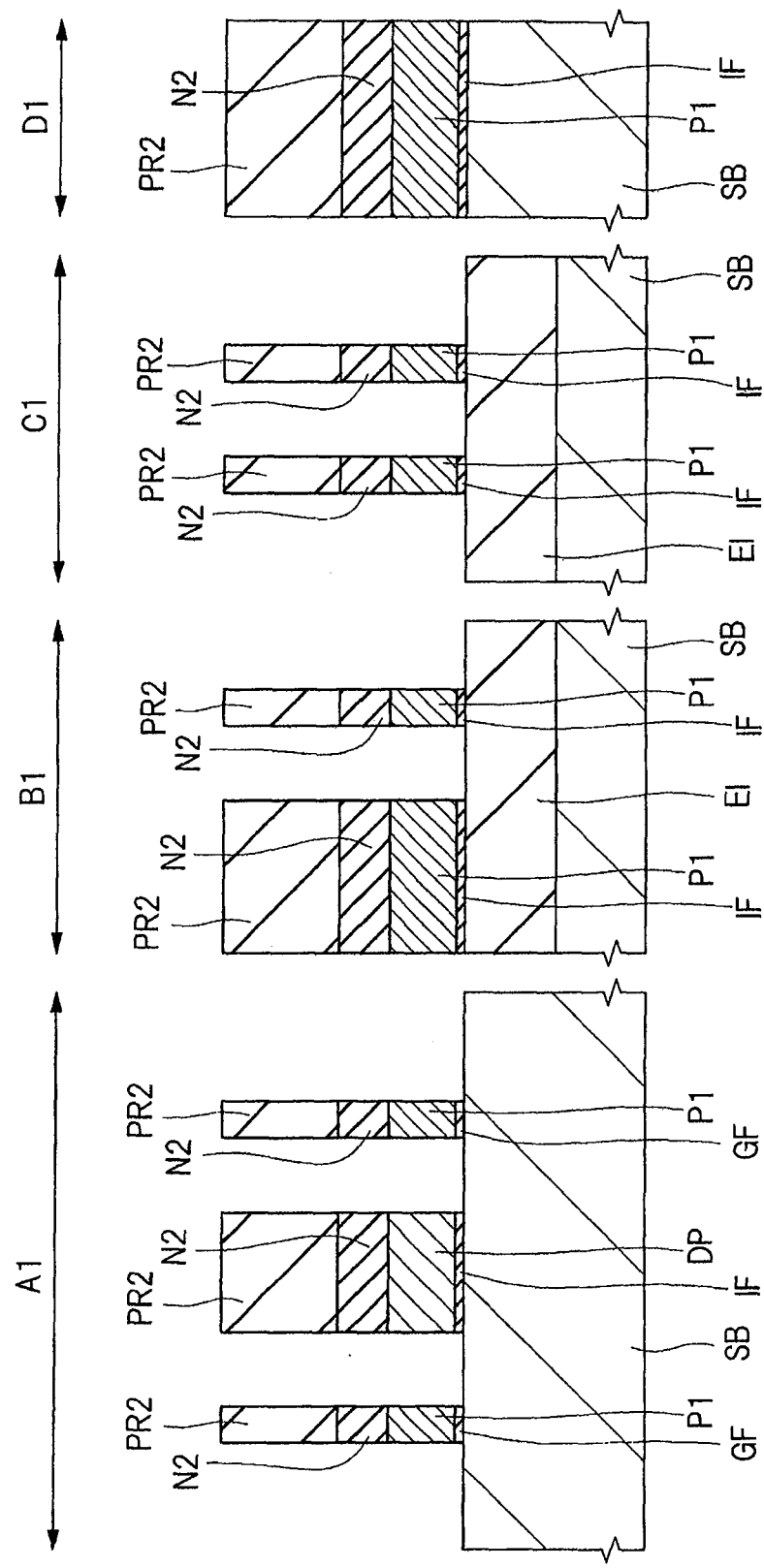
FIG. 4 is a cross-sectional view showing a method for manufacturing the semiconductor device following FIG. 3.

Then, as shown in FIG. 4, by a photolithography technology, the pattern of the photoresist film PR2 is formed over the silicon nitride film N2. Then, by a dry etching method using the photoresist film PR2 as a mask, the silicon nitride film N2, the polysilicon film P1, and the insulation film IF are partially removed. This results in the exposure of the top surface of the semiconductor substrate SB, and the top surface of the element isolation region EI. As a result, in the MONOS memory formation region A1, there are formed a dummy gate electrode DP formed of the polysilicon film P1, and a gate insulation film GF formed of the insulation film IF.

The polysilicon film P1 and the dummy gate electrode DP are spaced adjacent to each other. At this step, in the direction along the cross section of FIG. 4, namely, in the direction of arrangement of the dummy gate electrode DP and the polysilicon film P1, the width of the dummy gate electrode DP is set at, for example, 100 nm, and the width of the polysilicon film P1 is set at, for example, 60 nm. Further, in the same direction, the width of the polysilicon film P2 embedded between the dummy gate electrode DP and the polysilicon film P1 is set at, for example, 80 to 90 nm.

Herein, as shown in FIG. 4, in the MONOS memory formation region A1, when there are formed a plurality of patterns each formed of the insulation film IF arranged in the direction along the main surface of the semiconductor substrate SB, a pair of insulation films adjacent to one insulation film IF, and disposed in such a manner as to interpose the insulation film IF therebetween are referred to as gate insulation films GF. Further, in the MONOS memory formation region A1, when there are formed a plurality of patterns each formed of the polysilicon film P1 arranged in the direction along the main surface of the semiconductor substrate SB, a dummy gate electrode DP is formed between the adjacent polysilicon films P1. At this step, in the MONOS memory formation region A1, over the gate insulation film GF, there is formed the polysilicon film P1, and over the insulation film IF, there is formed the dummy gate electrode DP.

In other words, each insulation film IF is disposed between the adjacent gate insulation films GF. Between respective polysilicon films P1 formed in contact with respective top surfaces of the adjacent gate insulation films GF, there is formed the dummy gate electrode DP in contact with the top surface of the gate insulation film GF. The dummy gate electrode DP is a sacrifice pattern which is removed in a later step, and is not left in the semiconductor device completed later.

Figure 5:
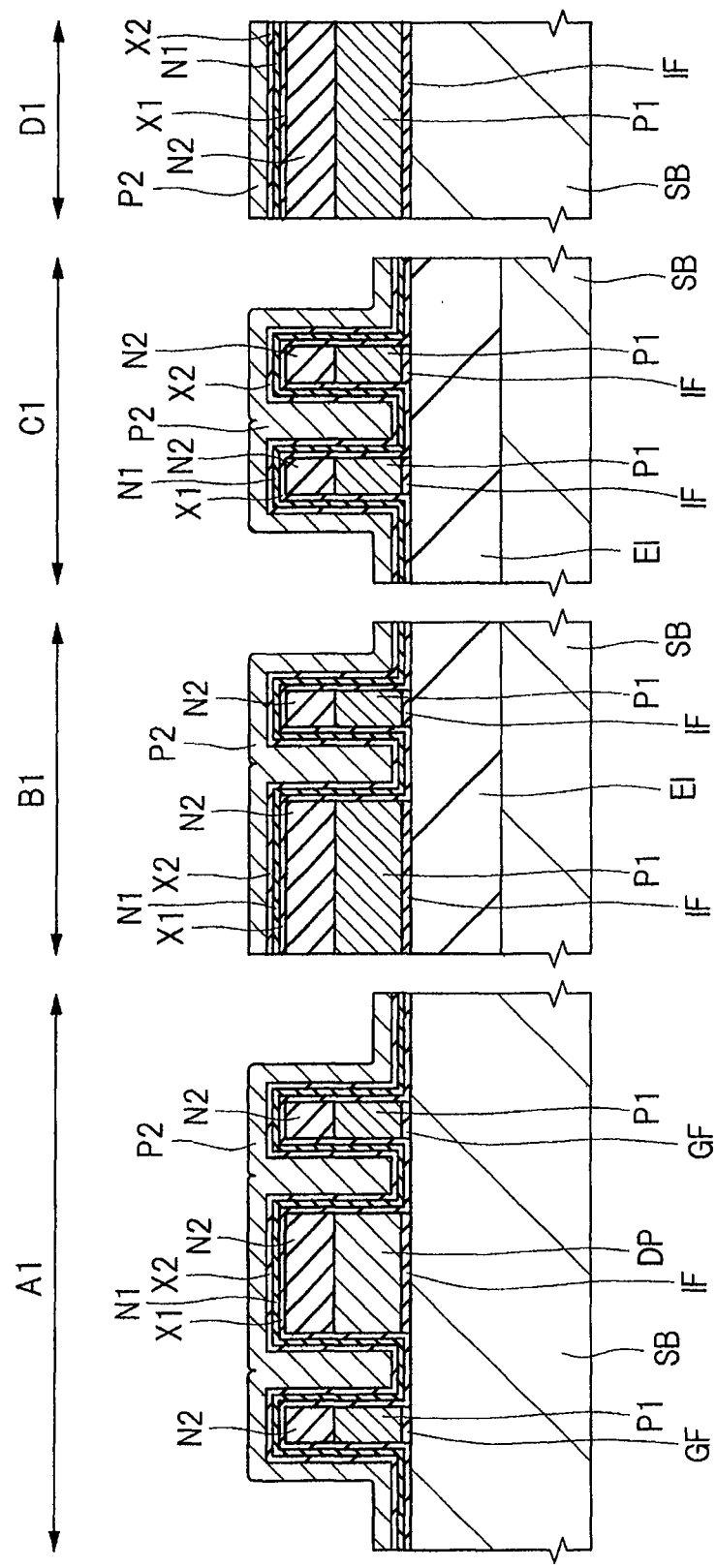
FIG. 5 is a cross-sectional view showing a method for manufacturing the semiconductor device following FIG. 4.

Then, as shown in FIG. 5, after removing the photoresist film PR2, using, for example, a CVD method, entirely over the main surface of the semiconductor substrate SB, there are sequentially formed a silicon oxide film X1, a silicon nitride film N1, a silicon oxide film X2, and a polysilicon film P2. As a result, the top surface and the sidewall of the pattern formed of a lamination film of the insulation film IF, the polysilicon film P1, and the silicon nitride film N2 are covered with the silicon oxide film X1. Whereas, the top surface and the sidewall of the pattern formed of a lamination film of the insulation film IF, the dummy gate electrode DP, and the silicon nitride film N2 are covered with the silicon oxide film X1. Still further, the top surface and the sidewall of the pattern formed of a lamination film of the gate insulation film GF, the polysilicon film P1, and the silicon nitride film N2 are covered with the silicon oxide film X1. Incidentally, below, the lamination film formed of the silicon oxide film X1, the silicon nitride film N1, and the silicon oxide film X2 may be simply referred to as an ONO film.

At this step, over the semiconductor substrate SB, there are formed a plurality of the patterns of the polysilicon films P1. The trench between the adjacent polysilicon films P1 is fully filled with the silicon oxide film X1, the silicon nitride film N1, the silicon oxide film X2, and the polysilicon film P2. However, at a site where the distance between the polysilicon films P1 is large, the space between the polysilicon films P1 is not fully filled. The trench between the dummy gate electrode DP and the polysilicon film P1 is fully filled with the silicon oxide film X1, the silicon nitride film N1, the silicon oxide film X2, and the polysilicon film P2.

Figure 6:
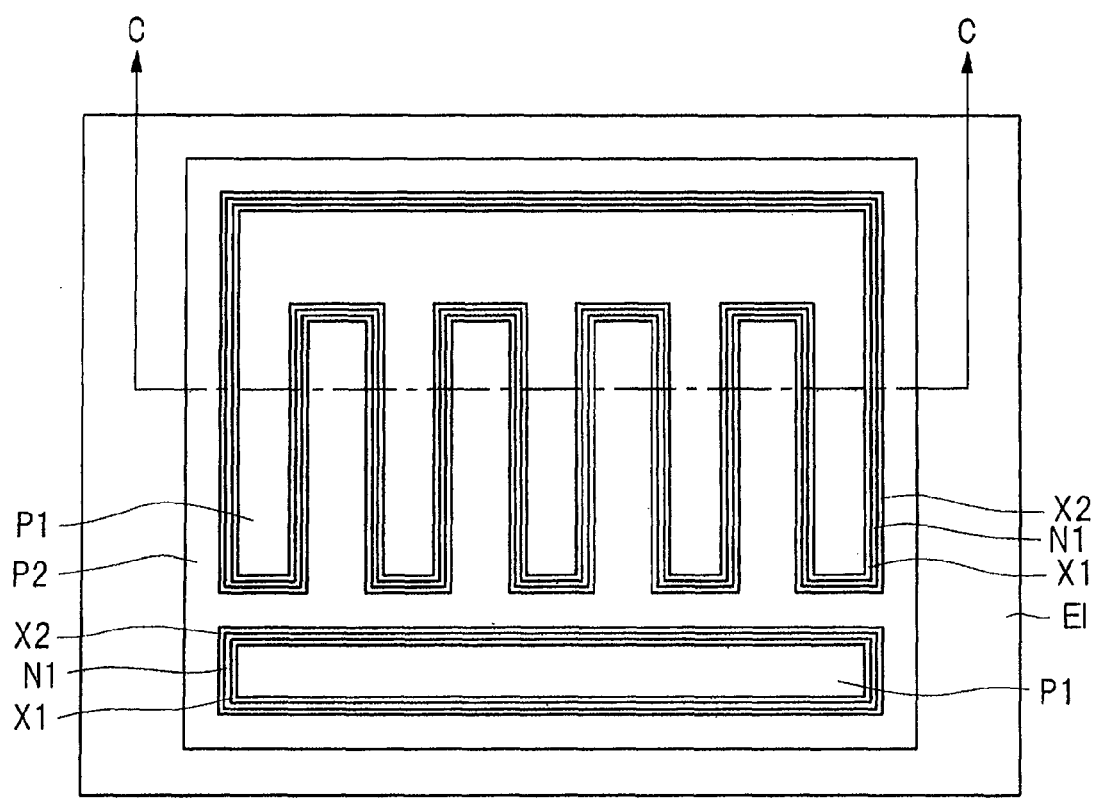
FIG. 6 is a plane layout showing a method for manufacturing the semiconductor device following FIG. 5.
Figure 7:
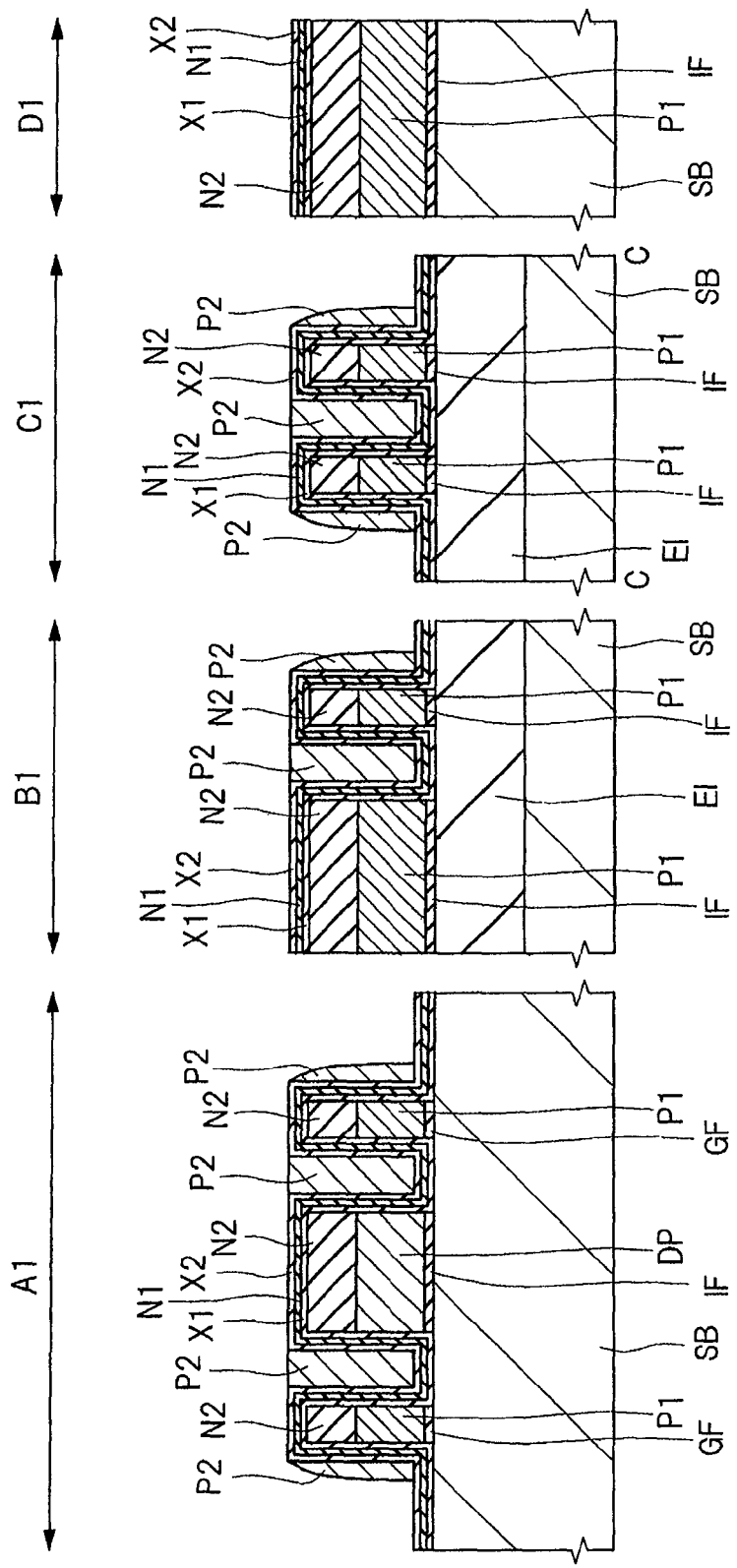
FIG. 7 is a cross-sectional view showing a method for manufacturing the semiconductor device following FIG. 5.

Then, as shown in FIGS. 6 and 7, the polysilicon film P2 is partially removed using a dry etching method, thereby to expose the top surface of the silicon oxide film X2. FIG. 6 is a plane layout of the semiconductor device during a manufacturing step. The capacitive element formation region C1 of FIG. 7 shows the cross section along line C-C of FIG. 6. In other words, FIG. 6 is a plane layout showing a region where the capacitive element is formed of the semiconductor device of the present embodiment. Incidentally, the line C-C of FIG. 6 crosses five portions of the polysilicon film P1 and six portions of the polysilicon film P2. However, in FIG. 7, for simplification of the drawing, in the capacitive element formation region C1, the polysilicon films P1 and P2 are shown in a partially omitted form.

Incidentally, in FIG. 6, for easy understanding of the arrangement of the polysilicon films P1 and P2, the silicon nitride film N2 and the ONO film over the polysilicon film P1 are not shown. Whereas, the ONO film over the element isolation region EI in the region not covered with the polysilicon films P1 and P2 is partially not shown.

As shown in FIG. 7, the polysilicon film P2 immediately over the dummy gate electrode DP is removed. Further, the height of the top surface of the polysilicon film P2 embedded between the adjacent polysilicon films P1, or between the adjacent polysilicon film P1 and dummy gate electrode DP is almost the same height as the height of the top surface of the silicon oxide film X2 over the silicon nitride film N2. At this step, at the sidewall of the lamination film of the polysilicon film and the silicon nitride film N2, the sidewall being closer to a region on the side of the lamination film not fully filled with the polysilicon film P2 in the deposition step described by reference to FIG. 5, the polysilicon film P2 is formed in a sidewall shape in a self-alignment manner via the silicon oxide film X1, the silicon nitride film N1, and the silicon oxide film X2.

Incidentally, the trench between the dummy gate electrode DP and the polysilicon film P1 has been still fully filled with the silicon oxide film X1, the silicon nitride film N1, the silicon oxide film X2, and the polysilicon film P2. The polysilicon film P2 is not in a sidewall shape.

As shown in FIG. 6, in a capacitive element formation region, the polysilicon film P1 is disposed in such a manner as to be surrounded by the polysilicon film P2 formed over the element isolation region EI. Between the polysilicon films P1 and P2, there is formed the ONO film formed of the silicon oxide film X1, the silicon nitride film N1, and the silicon oxide film X2. For this reason, the polysilicon films P1 and P2 are insulated from each other.

The pattern of the polysilicon film P2 surrounds two polysilicon film P1 patterns. One comb type polysilicon film P1 pattern of the two polysilicon film P1 patterns is used for generating a capacity between it and the polysilicon film P2. Another polysilicon film P1 pattern extending in one direction is disposed for coupling a contact plug (coupling member) to the polysilicon film P2 with reliability. The polysilicon film P1 disposed for generating a capacity has a comb type shape including a pattern extending in a first direction, and a plurality of patterns extending in a second direction orthogonal to the first direction, and arranged in the first direction. Each between the plurality of patterns extending in the second direction, there is formed the polysilicon film P2 extending in the second direction. In the first direction, the polysilicon films P1 and P2 are alternately formed. Thus, the polysilicon film P2 also has a comb type shape including a plurality of patterns extending in the second direction.

Figure 8:
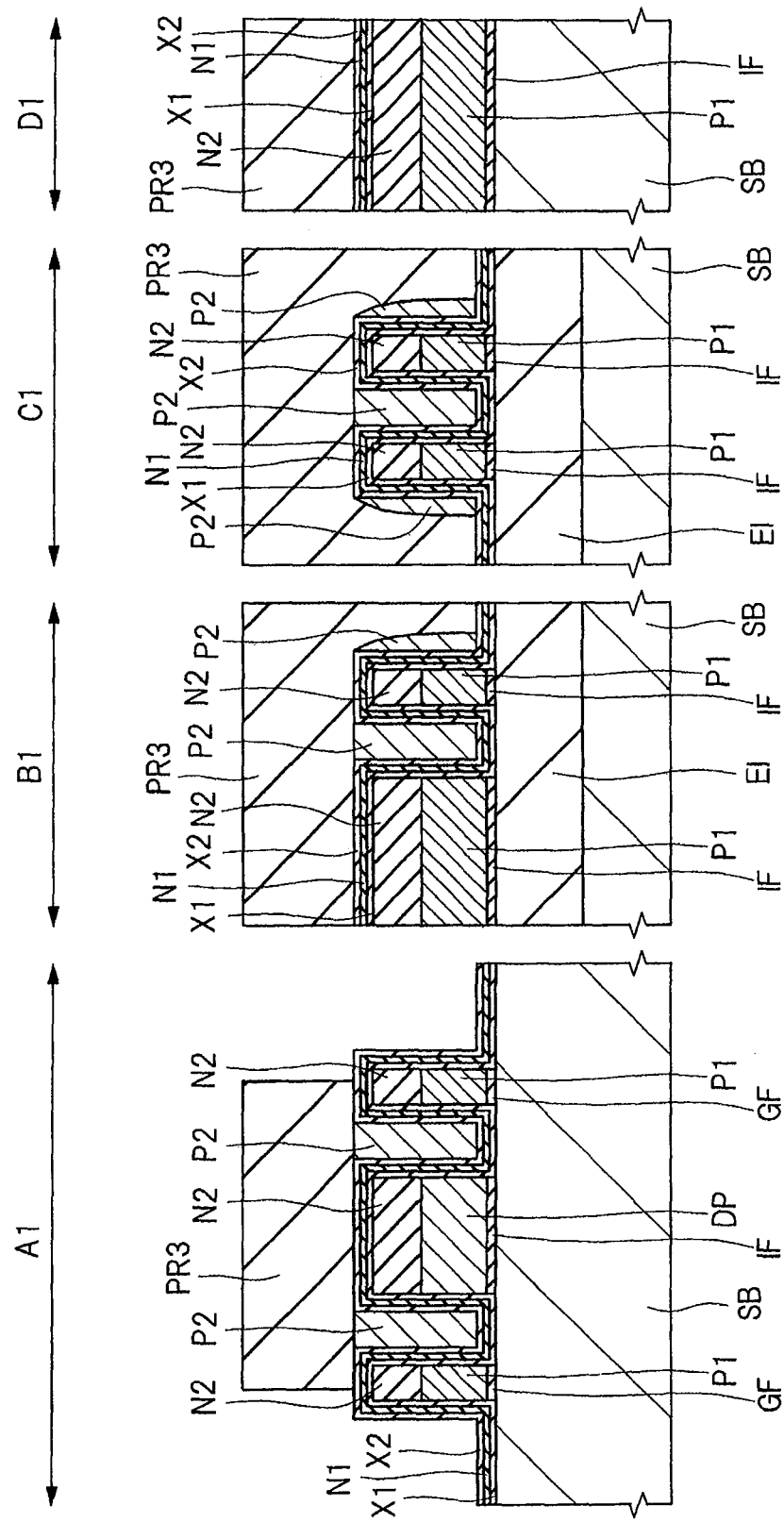
FIG. 8 is a cross-sectional view showing a method for manufacturing the semiconductor device following FIG. 7.

Then, as shown in FIG. 8, by an isotropic dry etching method using a photoresist film PR3 formed over the semiconductor substrate SB by a photolithography technology as a mask, there is removed the polysilicon film P2 formed in a sidewall shape at each sidewall of the polysilicon film P1 via the ONO film. At this step, in the MONOS memory formation region A1, the polysilicon film P2 embedded between the polysilicon film P1 and the dummy gate electrode DP is covered with the photoresist film PR3, and hence is not removed. However, the polysilicon film P2 in a sidewall shape at each sidewall of the polysilicon film P1 is removed, so that the surface of the silicon oxide film X2 is exposed.

Further, the feeding part formation region B1, the capacitive element formation region C1, and the low breakdown voltage element formation region D1 are covered with the photoresist film PR3. For this reason, some of the polysilicon films P2 each in a sidewall shape formed in the feeding part formation region B1 and the capacitive element formation region C1 are not removed, and are left. However, even in the feeding part formation region B1 and the capacitive element formation region C1, in some regions not shown in FIG. 8, as shown in FIGS. 9 and 10 used later, in the etching step of FIG. 8, the sidewall-shaped polysilicon films P2 are removed due to being exposed from the photoresist film PR3.

Figure 9:
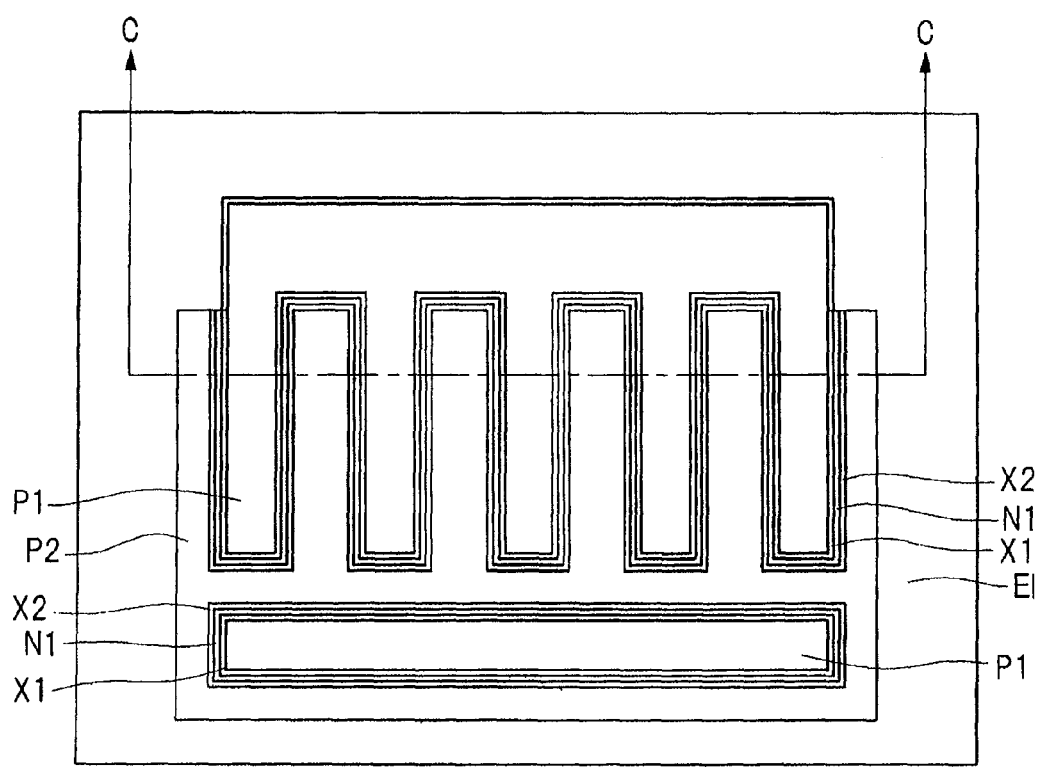
FIG. 9 is a plane layout showing a method for manufacturing the semiconductor device following FIG. 8.
Figure 10:
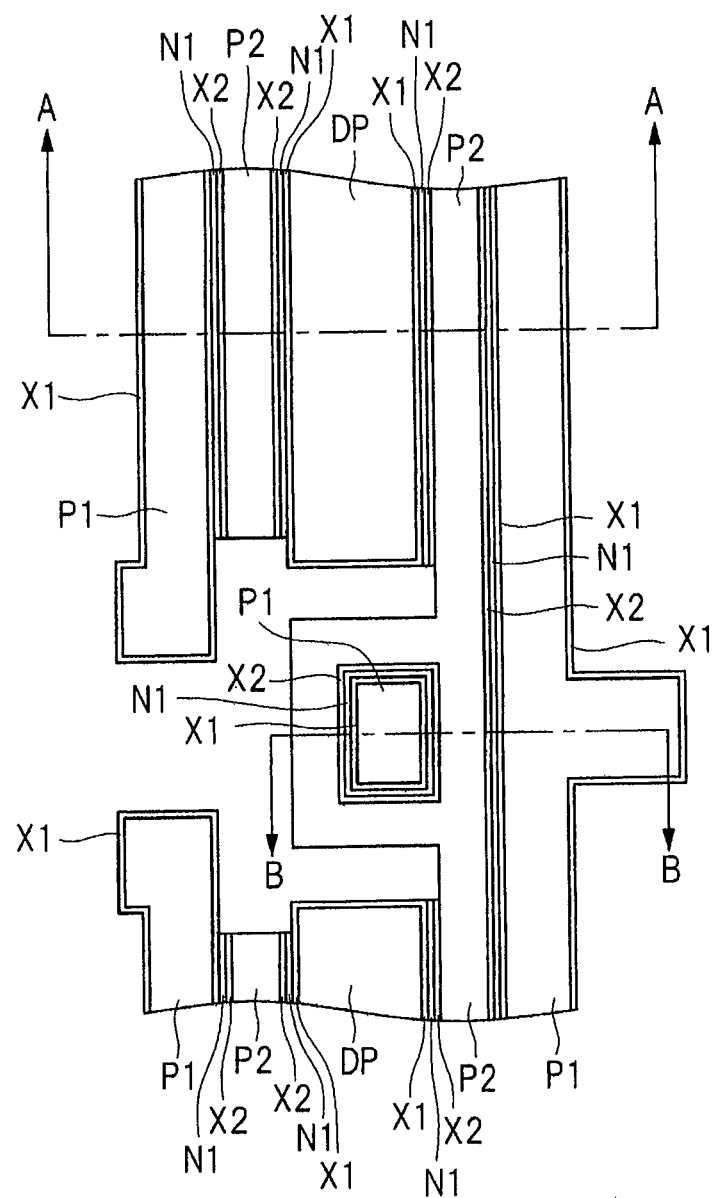
FIG. 10 is a plane layout showing a method for manufacturing the semiconductor device following FIG. 8.
Figure 11:
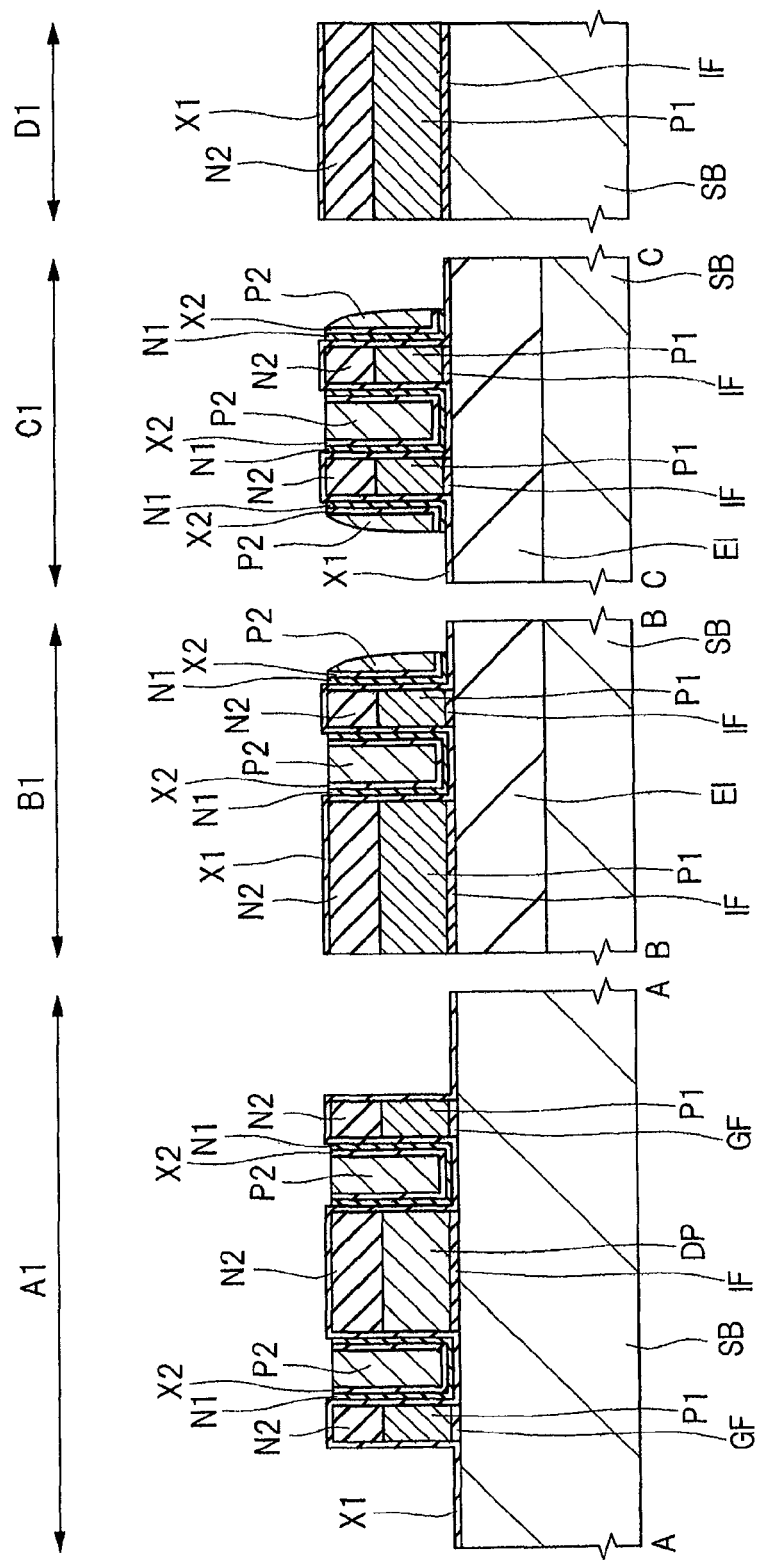
FIG. 11 is a cross-sectional view showing a method for manufacturing the semiconductor device following FIG. 8.

Then, FIGS. 9, 10, and 11, after removing the photoresist film PR3, using a wet etching method, a part of the silicon oxide film X2 and a part of the silicon nitride film N1 at the top of the ONO film are removed. As a result, the surface of the silicon oxide film X1 is exposed.

FIG. 9 is a plane layout showing the capacitive element formation region of the semiconductor device during a manufacturing step as with FIG. 6. The capacitive element formation region C1 of FIG. 11 is a cross section along line C-C of FIG. 9. FIG. 10 is a plane layout showing a MONOS memory formation region and the formation region of the feeding part of the MONOS of the semiconductor device during a manufacturing step. The MONOS memory formation region A1 of FIG. 11 is a cross section along line A-A of FIG. 10. The feeding part formation region B1 of FIG. 11 is a cross section along line B-B of FIG. 10. Incidentally, in FIGS. 9 and 10, for easy understanding of the arrangement of the polysilicon films P1 and P2, the silicon oxide film X1 and the silicon nitride film N2 over the polysilicon film P1 are not shown. Further, no other silicon oxide film X1, silicon nitride film N1, and silicon oxide film X2 than those formed over respective sidewalls of the polysilicon films P1 and P2 are shown.

As shown in FIGS. 9, 10, and 11, in regions not covered with the polysilicon film P2, by the wet etching step, the silicon oxide film X2 and the silicon nitride film N1 are removed. As a result, the silicon oxide film X1 is exposed. In other words, the silicon oxide film X2 and the silicon nitride film N1 adjacent to the sidewalls and the bottom surface of the polysilicon film P1 are left, and the silicon oxide films X2 and the silicon nitride films N1 in other regions are removed.

In the plane layouts shown in FIGS. 9 and 10, the sidewalls of some polysilicon films P1 are covered with only the silicon oxide film X1, and are not covered with the polysilicon film P2, the silicon oxide film X2, and the silicon nitride film N1. As with the polysilicon film P1, the sidewalls of the dummy gate electrodes DP in some regions are not covered with the polysilicon film P2, the silicon oxide film X2, and the silicon nitride film N1.

Thus, the regions which are the sidewalls of the polysilicon film P1, and the dummy gate electrode DP, and are not covered with the polysilicon film P2, the silicon oxide film X2, and the silicon nitride film N1 are the regions from which the sidewall-shaped polysilicon film P2 has been removed by the dry etching step described by reference to FIG. 8. Herein, in the region where the silicon oxide film X2 and the silicon nitride film N1 have been removed, the silicon oxide film X1 is not removed, and is left. This is for preventing the occurrence of the following situation: in a step described later by reference to FIG. 12, a photoresist film PR4 is formed, and then, the photoresist film PR4 is removed; as a result, the semiconductor substrate SB is damaged.

As shown in FIG. 9, in the comb type polysilicon film P1, the polysilicon film P2 at each sidewall of the pattern extending in the first direction is removed, and the polysilicon film P2 at each sidewall of a plurality of patterns extending in the second direction is not removed. Thus, only the polysilicon film P2 at each sidewall of the pattern extending in the first direction is removed. This is for preventing the occurrence of the following situation: as described later, when a contact plug is coupled to the comb type polysilicon film P1, the polysilicon film P1 and the polysilicon film P2 are electrically continued to each other due to misalignment of the coupling site of the contact plug, the contact with the silicide layer, or the like.

As shown in FIG. 10, the polysilicon films P1 and P2, and the dummy gate electrode DP extend in the same direction, and are arranged side by side in a direction orthogonal to the direction of extension. The polysilicon film P1 in the MONOS memory formation region A1 and the polysilicon film P1 in the feeding part formation region B1 shown in FIG. 11 are formed integrally with each other as shown in FIG. 10. Similarly, the polysilicon film P2 in the MONOS memory formation region A1 and the polysilicon film P2 in the feeding part formation region B1 shown in FIG. 11 are formed integrally with each other as shown in FIG. 10. However, the dummy gate electrode DP does not extend to the feeding part.

In the MONOS memory formation region shown in FIG. 10, the dummy gate electrode DP is disposed in such a manner as to be interposed between a pair of polysilicon films P2 via the ONO film in the direction orthogonal to the direction of extension. Whereas, the dummy gate electrode DP, and the pair of polysilicon films P2 interposing the dummy gate electrode DP therebetween are disposed in such a manner as to be interposed between a pair of polysilicon films P1 in the same direction. The ONO film is interposed between the polysilicon film P1 and the polysilicon film P2. In the feeding part formation region B1 of FIG. 11, one of the pair of polysilicon films P1, and one of the pair of polysilicon films P2 are shown. The others of the polysilicon films P1 and P2 are not shown in FIG. 11.

In the feeding part formation region, the pattern of the polysilicon film P2 surrounds the isolated pattern of the polysilicon film P1. This is the structure provided for coupling the contact plug to the polysilicon film P2 formed in a sidewall shape, and having a small width with reliability as described later.

Figure 12:
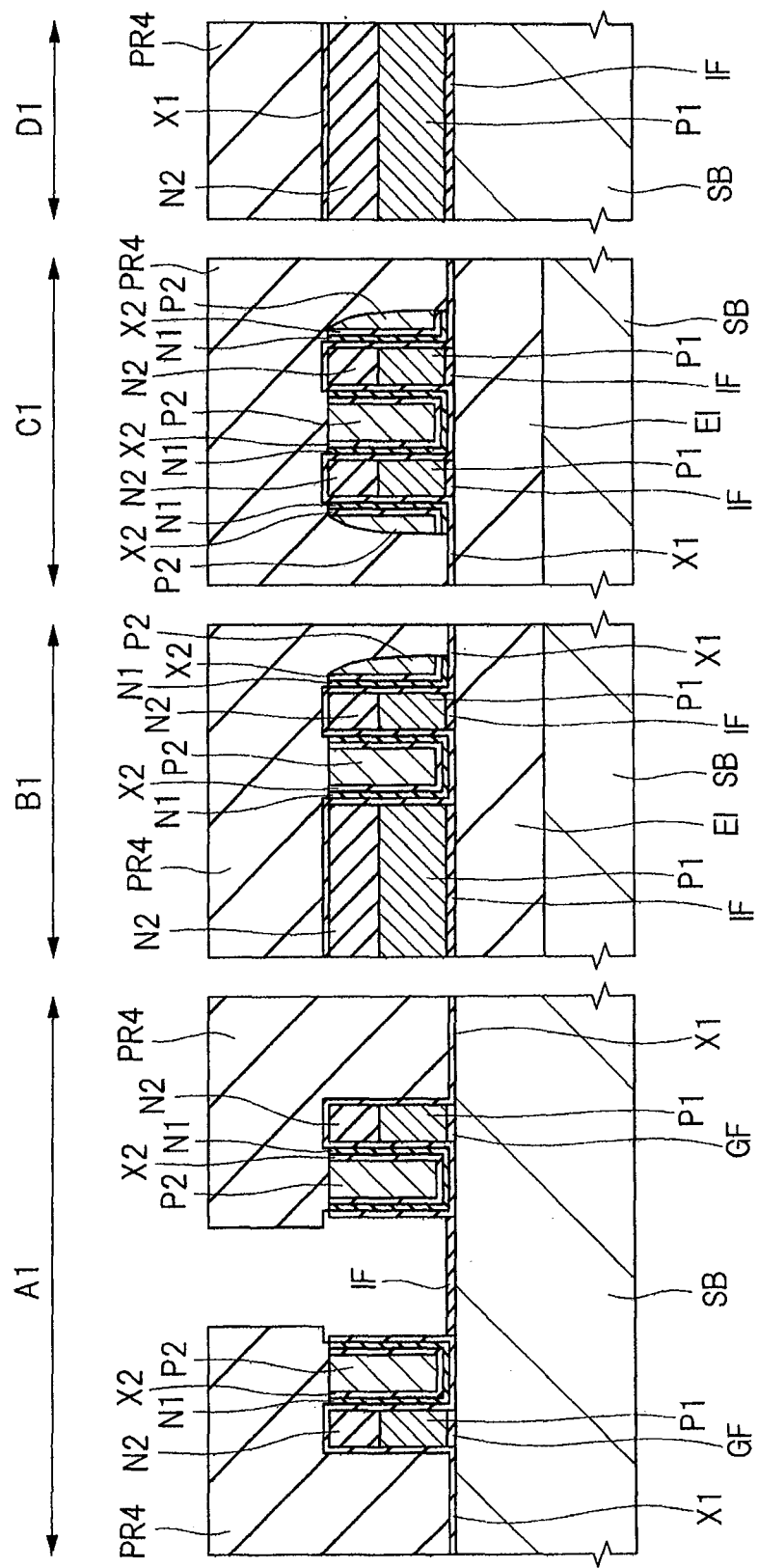
FIG. 12 is a cross-sectional view showing a method for manufacturing the semiconductor device following FIG. 11.

Then, as shown in FIG. 12, by a photolithography technology, a pattern of a photoresist film PR4 is formed over the semiconductor substrate SB. The photoresist film PR4 covers the feeding part formation region B1, the capacitive element formation region C1, and the low breakdown voltage element formation region D1, and exposes the top surface of the silicon oxide film X1 immediately over the dummy gate electrode DP in the MONOS memory formation region A1 (see FIG. 11). Specifically, the photoresist film PR4 is a pattern covering the surfaces of the gate insulation film GF, the polysilicon films P1 and P2, the silicon nitride films N1 and N2, and the silicon oxide films X1 and X2, and exposing the top surface of the silicon oxide film X1 immediately over the dummy gate electrode DP in the MONOS memory formation region A1.

Thereafter, by an isotropic dry etching method, the silicon oxide film X1 immediately over the dummy gate electrode DP, the silicon nitride film N2 immediately over the dummy gate electrode DP, and the dummy gate electrode DP are sequentially removed. This results in exposure of the sidewall of the silicon oxide film X1 in contact with the sidewall of the dummy gate electrode DP, and exposure of the insulation film IF immediately under the region from which the dummy gate electrode DP has been removed.

Herein, further, by an isotropic dry etching method, there may be removed the silicon oxide film X1 and the silicon nitride film N1 forming the ONO film between the region where the dummy gate electrode DP was formed, and the polysilicon film P2. The silicon nitride film N1 in the MONOS memory formation region A1 is an insulation film to be a charge accumulation film of the MONOS memory formed in a later step. In order to operate the MONOS memory, it becomes important to accumulate electric charges in the silicon nitride film N1 immediately under the polysilicon film P2 to be a memory gate in a later step. However, when electric charges are accumulated in, or move into the silicon nitride film N1 formed not immediately under the polysilicon film P2, but at the sidewall thereof, the characteristics or reliability of the MONOS memory may be reduced.

Thus, as described above, the silicon oxide film X1 and the silicon nitride film N1 forming the ONO film between the region where the dummy gate electrode DP was formed, and the polysilicon film P2 are removed. As a result, it is possible to prevent electric charges from being accumulated in other silicon nitride films N1 than the silicon nitride film N1 immediately under the polysilicon film P2. However, in the present embodiment, assuming that the silicon oxide films X1 and X2 and the silicon nitride film N1 forming the ONO film between the region where the dummy gate electrode DP was formed and the polysilicon film P2 are not removed, and are left, a description will be given to a method for manufacturing a semiconductor device.

Figure 13:
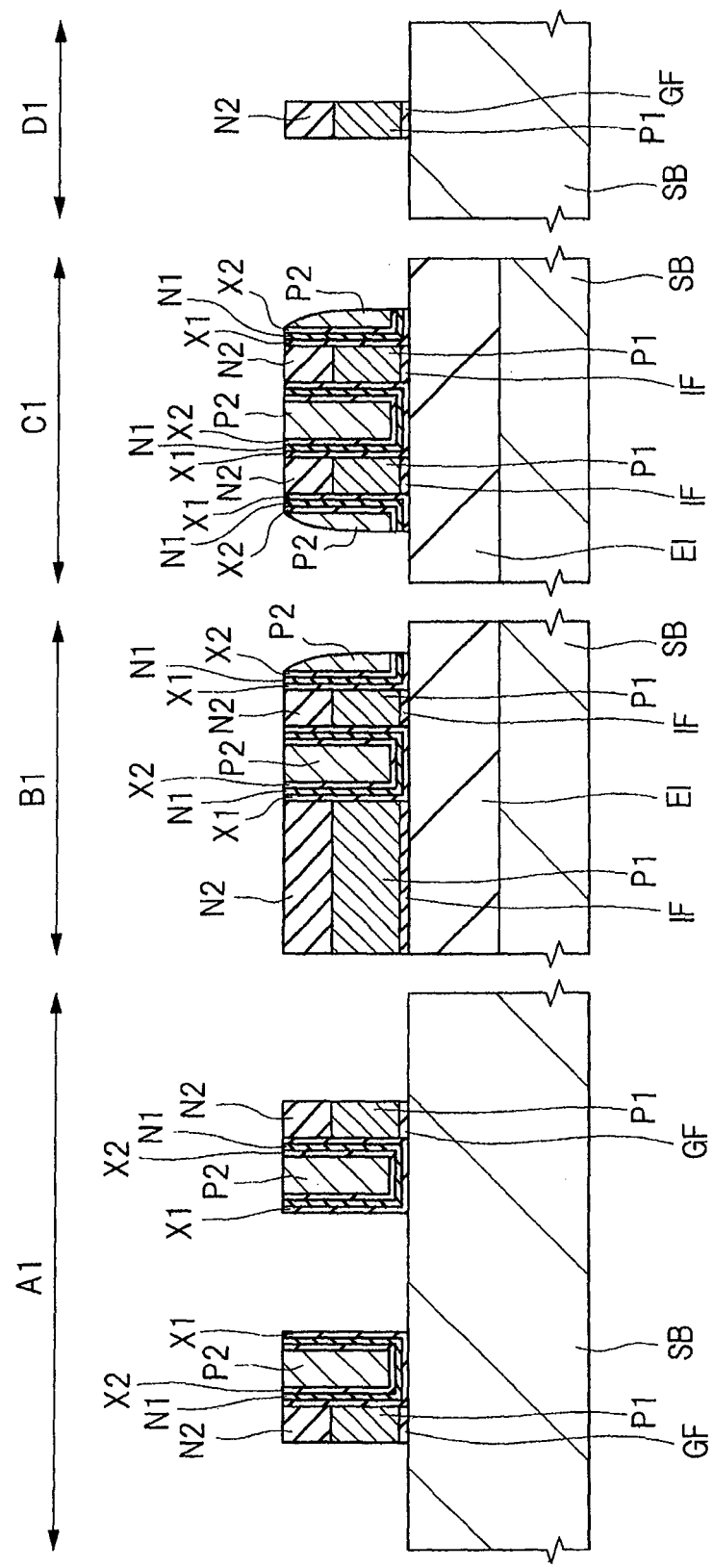
FIG. 13 is a cross-sectional view showing a method for manufacturing the semiconductor device following FIG. 12.

Then, as shown in FIG. 13, after removing the photoresist film PR4, the ONO film formed adjacent to the sidewalls and the bottom of the polysilicon film P2 is left, and the silicon oxide films X1 in other regions are removed. This results in exposure of the main surface of the semiconductor substrate SB. As a result, the sidewalls of the polysilicon film P1 and the silicon nitride film N2, which are not adjacent to the polysilicon film P2, are exposed, and the top surface of the silicon nitride film N2 is exposed. Further, the insulation film IF immediately under the region from which the dummy gate electrode DP was removed is also removed simultaneously. As a result, the top surface of the semiconductor substrate SB is exposed.

Thus, in the present embodiment, in the step described by reference to FIG. 12, following the step of removing the dummy gate electrode DP, the insulation film IF in the MONOS memory formation region A1 is not removed, and the photoresist film PR4 is removed. Then, in the step shown in FIG. 13, together with a part of the silicon oxide film X1, the insulation film IF in the MONOS memory formation region A1 is removed. By the step of removing the photoresist film PR4 and a part of the silicon oxide film X1 with such a procedure, it is possible to prevent the substrate from being damaged such as being exposed to a cleaning solution, an etchant, or the like, thereby to be cut.

At this step, it can be considered that the silicon oxide film X1 exposed at the side surface of the ONO film between the region where the dummy gate electrode DP (see FIG. 11) was formed, and the polysilicon film P2 is also removed. However, herein, a description will be given assuming that the silicon oxide film X1 is not removed, but is left. However, it does not matter if the silicon oxide film X1 is removed.

Then, using a photolithography technology and a dry etching method, the silicon nitride film N2, the polysilicon film P1, and the insulation film IF in the low breakdown voltage element formation region D1 are processed. This results in the formation of a gate insulation film GF formed of the insulation film IF.

Figure 14:
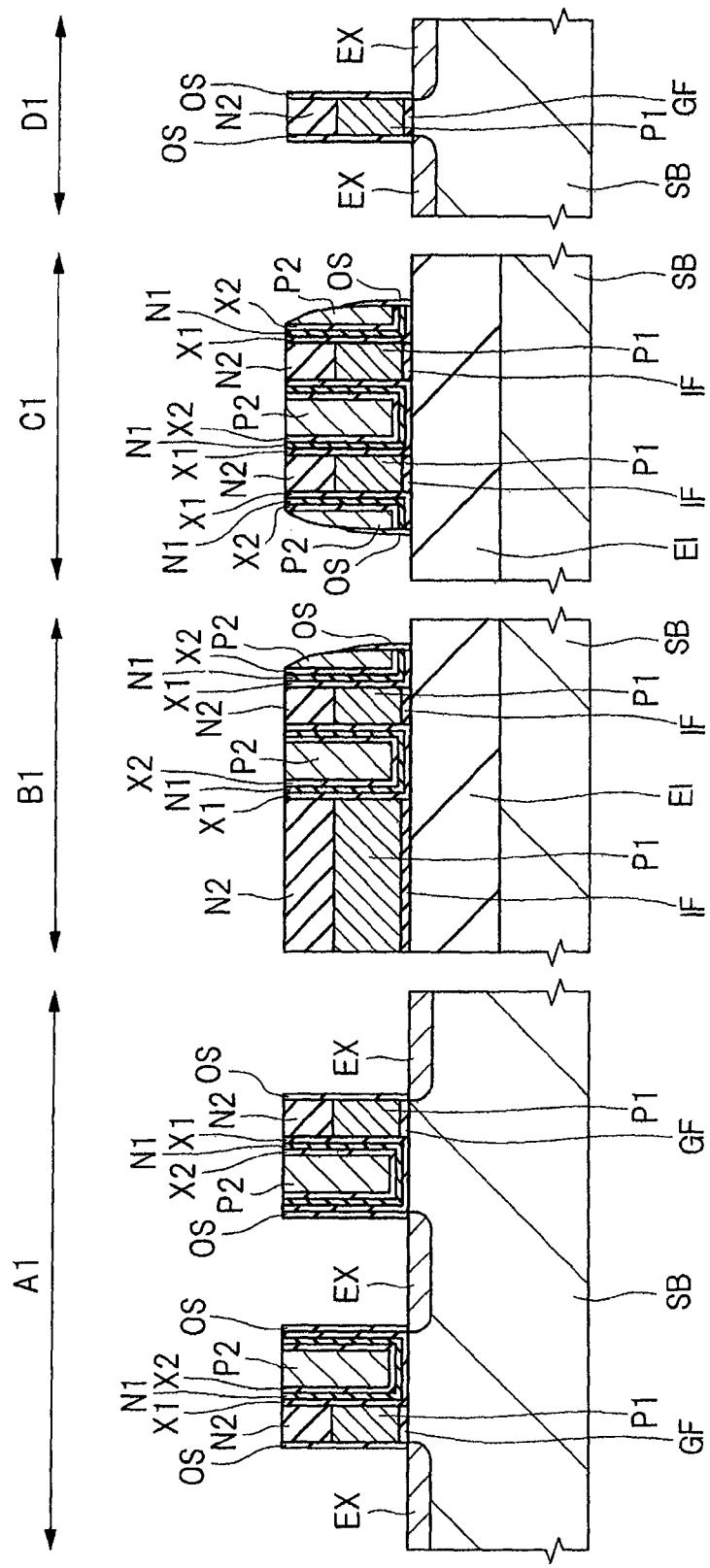
FIG. 14 is a cross-sectional view showing a method for manufacturing the semiconductor device following FIG. 13.

Then, as shown in FIG. 14, entirely over the top surface of the semiconductor substrate SB, using, for example, a CVD method, a silicon nitride film is formed (deposited). Then, by a dry etching method, the silicon nitride film is partially removed, thereby to expose the main surface of the semiconductor substrate SB. As a result, an offset spacer OS formed of the silicon nitride film is formed in a self-alignment manner at the sidewall of each structure over the semiconductor substrate SB.

Specifically, in the MONOS memory formation region A1, the offset spacers OS are formed at respective sidewalls on the opposite sides of a structure formed of a lamination film including the gate insulation film GF, the polysilicon film P1, and the silicon nitride film N2, and a lamination film of the ONO film and the polysilicon film P2 in contact with one sidewall of the lamination film.

In the feeding part formation region B1 and the capacitive element formation region C1, on each of the sidewalls on the opposite sides of a structure formed of a lamination film including the insulation film IF, the polysilicon film P1, and the silicon nitride film N2, and a lamination film of the ONO film and the polysilicon film P2 in contact with one sidewall of the lamination, an offset spacer OS is formed. Incidentally, in the feeding part formation region B1, on one sidewall of the structure, there is formed the sidewall-shaped polysilicon film P2. Accordingly, the offset spacer OS is formed on the sidewall of the sidewall-shaped polysilicon film P2. Whereas, in the capacitive element formation region C1, at both sidewalls of the structure, there are formed the sidewall-shaped polysilicon films P2. Accordingly, the offset spacers OS are formed on the sidewalls of respective sidewall-shaped polysilicon films P2, respectively.

In the low breakdown voltage element formation region D1, at the sidewalls on the opposite sides of the lamination film including the gate insulation film GF, the polysilicon film P1, and the silicon nitride film N2, there are formed the offset spacers OS, respectively.

Then, using an ion implantation method, into the top surface of the semiconductor substrate SB, N type impurities (e.g., As (arsenic)) are implanted in a relatively low concentration. As a result, in the main surface of the semiconductor substrate SB in the MONOS memory formation region A1 and the low breakdown voltage element formation region D1, extension regions EX are formed. In the MONOS memory formation region A1, in each top surface of the semiconductor substrate SB exposed on the sides of the structure including the polysilicon films P1 and P2 in contact with each other via the ONO film, there is formed the extension region EX. Therefore, also in the top surface of the semiconductor substrate SB between the adjacent polysilicon films P2, and immediately under the region where the dummy gate electrode DP (see FIG. 11) was formed, there is formed the extension region EX.

In the low breakdown voltage element formation region D1, in the top surface of the semiconductor substrate SB exposed at each side of the polysilicon film P1, there is formed the extension region EX. Incidentally, no extension region EX is formed in the element isolation region EI and its immediately underlying semiconductor substrate SB in the feeding part formation region B1 and the capacitive element formation region C1.

Figure 15:
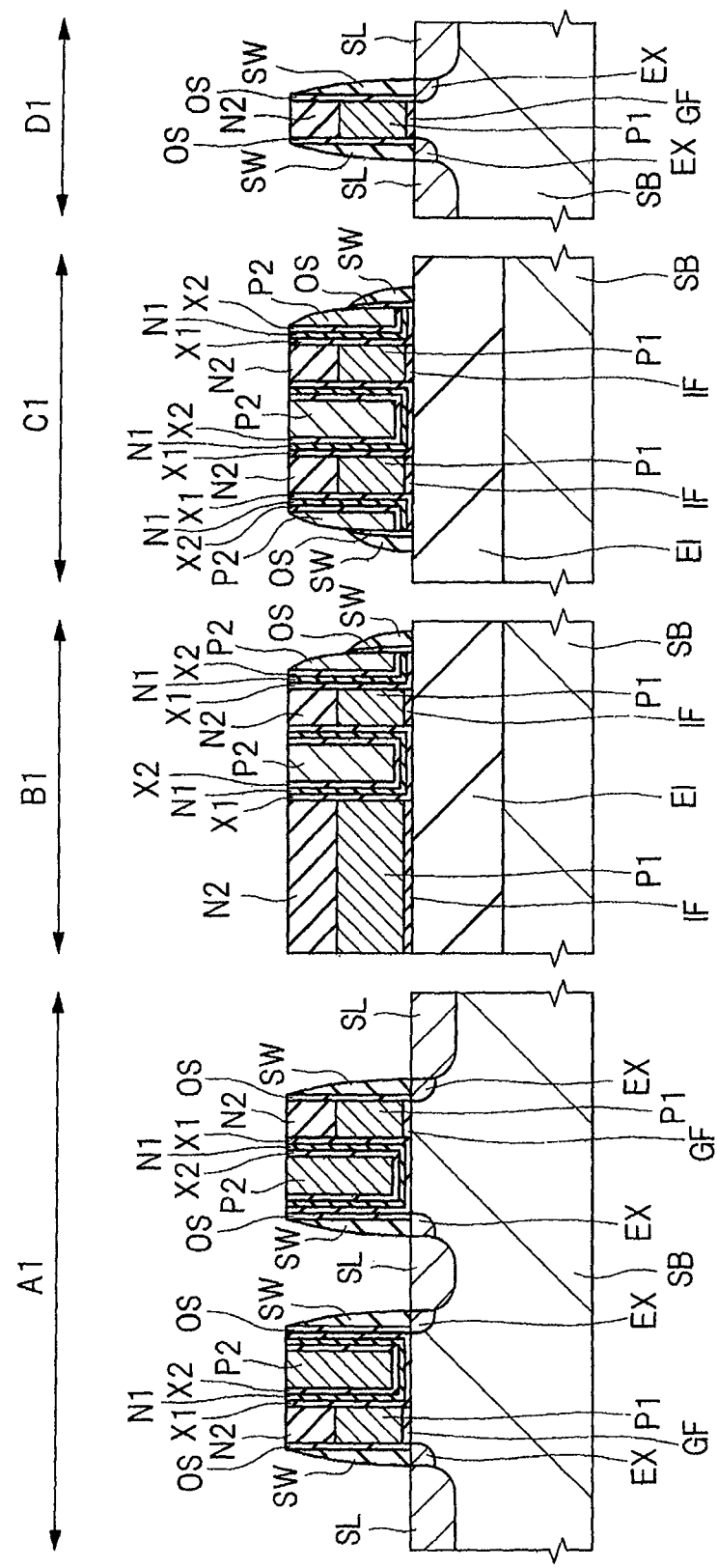
FIG. 15 is a cross-sectional view showing a method for manufacturing the semiconductor device following FIG. 14.

Then, as shown in FIG. 15, entirely over the main surface of the semiconductor substrate SB, using, for example, a CVD method, an insulation film is formed. Then, using a dry etching method, the insulation film is partially removed, so that the top surface of the semiconductor substrate SB is exposed. As a result, each sidewall SW formed of the insulation film is formed. The sidewall SW is formed in a self-alignment manner at the sidewall at which the offset spacer OS is exposed. Examples of the materials for the sidewall SW may include a silicon oxide film, or a lamination film of a silicon nitride film and a silicon oxide film.

Then, using an ion implantation method, N type impurities (e.g., As (arsenic)) are implanted into the top surface of the semiconductor substrate SB in a higher concentration than that in the ion implantation step performed for forming the extension region EX. As a result, in each main surface of the semiconductor substrate SB in the MONOS memory formation region A1 and the low breakdown voltage element formation region D1, there is formed a diffusion layer SL higher in impurity concentration than the extension region EX. The diffusion layer SL is a semiconductor region deeper in junction depth than the extension region EX.

Incidentally, in the present embodiment, a one-time ion implantation step forms the extension regions EX in the MONOS memory formation region A1 and the low breakdown voltage element formation region D1. Further, a one-time ion implantation step forms the diffusion layers SL in the MONOS memory formation region A1 and the low breakdown voltage element formation region D1. However, in actuality, it can be considered that the ion implantation step is divided according to the type of the element, or the difference between the N type FET, P type FET, and the like to form the extension regions EX or the diffusion layers SL.

In the MONOS memory formation region A1, in each top surface of the semiconductor substrate Sb exposed from the structure including the polysilicon films P1 and P2 in contact with each other via the ONO film, the offset spacer OS and the sidewall SW on each sidewall of the structure, there is formed the diffusion layer SL. Therefore, also in the top surface of the semiconductor substrate SB between the adjacent polysilicon films P2, and immediately under the region where the dummy gate electrode DP (see FIG. 11) was formed, the diffusion layer SL is formed in such a manner as to be interposed between the extension regions EX.

In the low breakdown voltage element formation region D1, in the top surface of the semiconductor substrate SB exposed at each side of the polysilicon film P1, the offset spacer OS and the sidewall SW at each sidewall of the polysilicon film P1, there is formed the diffusion layer SL. Incidentally, the diffusion layer SL is not formed in the element isolation region EI and its immediately underlying semiconductor substrate SB in the feeding part formation region B1 and the capacitive element formation region C1.

By forming the diffusion layers SL, source/drain regions each including the extension region EX and the diffusion layer SL adjacent to the extension region EX are formed in respective top surfaces of the semiconductor substrate SB in the MONOS memory formation region A1 and the low breakdown voltage element formation region D1. The source/drain regions each have a LDD (Lightly Doped Drain) structure having the diffusion layer SL with a relatively higher impurity concentration, and the extension region EX lower in impurity concentration than the diffusion layer SL.

Herein, in the top surface of the semiconductor substrate SB surrounding the capacitive element formation region C1 (not shown), there may be formed a diffusion layer serving as the feeding part for the well. The well feeding part is, for example, a semiconductor region formed in a ring surrounding the periphery of the element isolation region EI in the capacitive element formation region C1 in plan view, in the main surface of the semiconductor substrate SB, and for supplying an electric potential to the semiconductor substrate. The well feeding part is formed by the same ion implantation step as the step of forming the diffusion layer SL, or can be formed by performing a different ion implantation step. The well feeding part will be described later by reference to FIG. 25.

Figure 16:
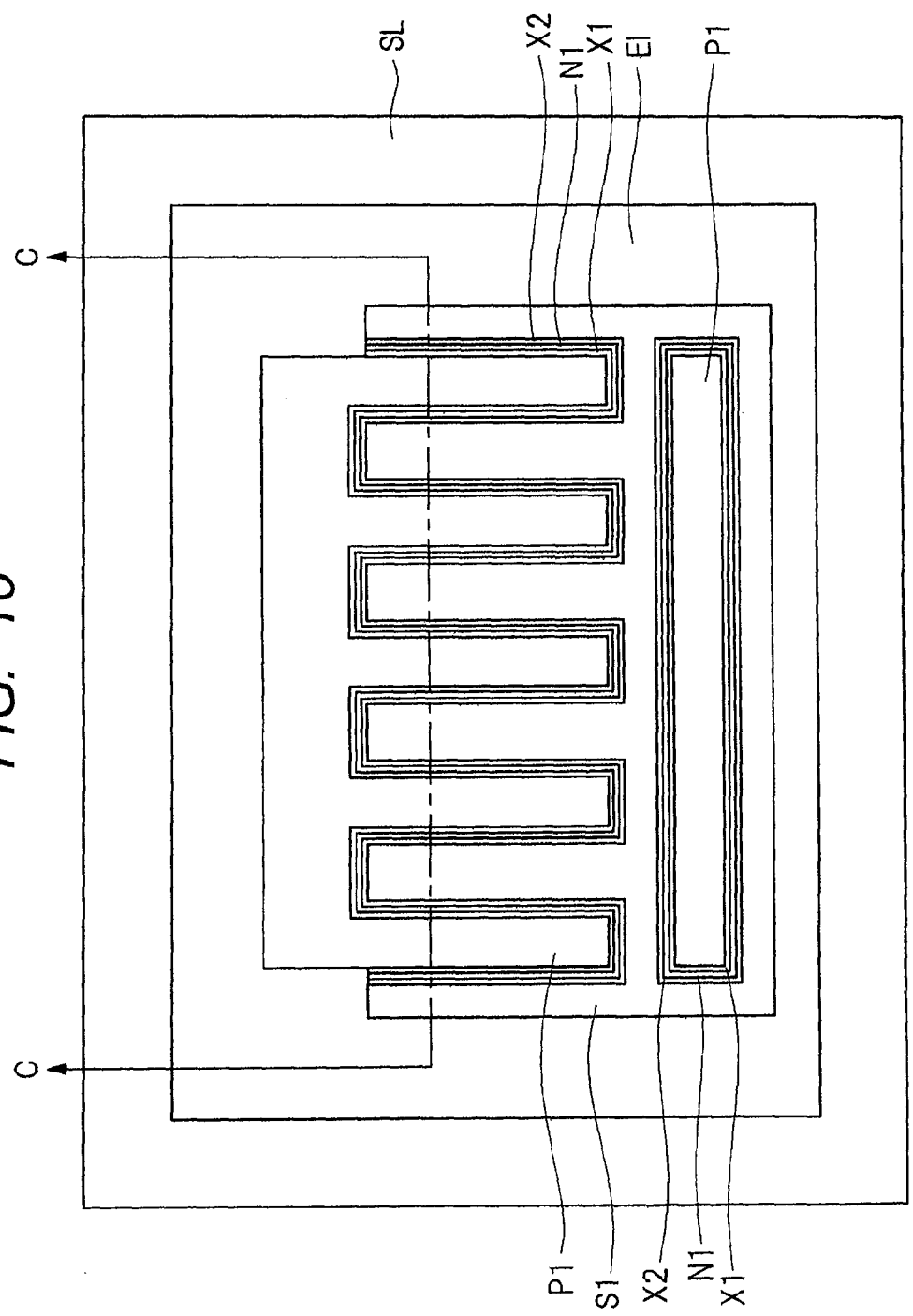
FIG. 16 is a plane layout showing a method for manufacturing the semiconductor device following FIG. 15.
Figure 17:
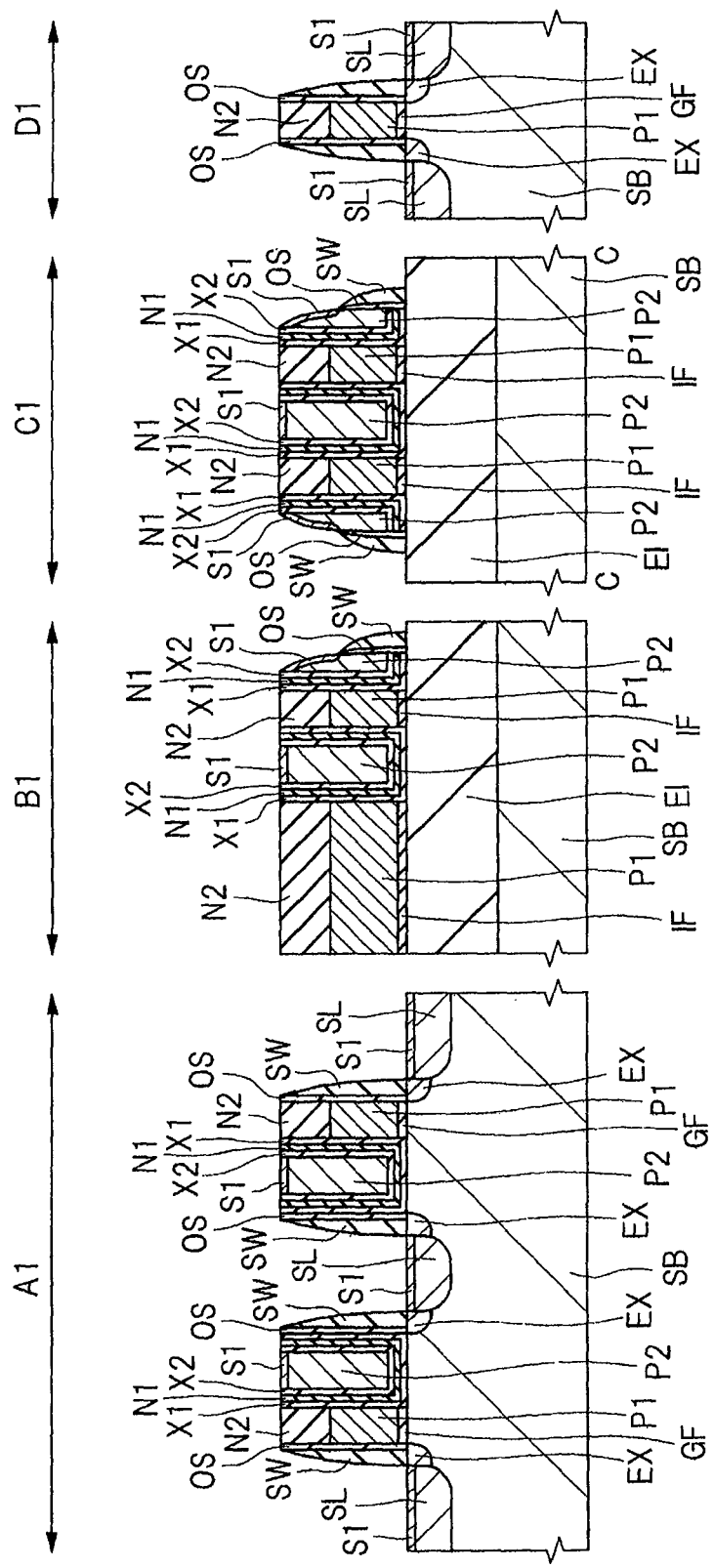
FIG. 17 is a cross-sectional view showing a method for manufacturing the semiconductor device following FIG. 15.

Then, as shown in FIGS. 16 and 17, using a known salicide technology, silicide layers S1 are formed on the top surface of the diffusion layer SL, and the top surface of the polysilicon film P2. FIG. 16 is a plane layout showing the semiconductor device during a manufacturing step. The capacitive element formation region C1 of FIG. 17 shows the cross section along line C-C of FIG. 16. In FIG. 16, for ease of understanding of the drawing, the silicon nitride film N2 over the polysilicon film P1 (see FIG. 17) is not shown.

In FIG. 16, as distinct from FIG. 9, the silicide layer S1 is formed over the polysilicon film P2 (see FIG. 17). Incidentally, the silicide layer S1 shown in FIG. 16 is removed by a polishing step described later.

The silicide layer S1 shown in FIG. 17 is a conductive film formed of, for example, cobalt silicide (CoSi). The silicide layer S1 is formed by forming a metal film of Co (cobalt) or the like over the semiconductor substrate SB, and then, allowing the metal film and the silicon film to react with each other by a heat treatment. At this step, the top surface of the polysilicon film P1 is covered with the silicon nitride film N2. For this reason, the silicide layer S1 is not formed over the top surface of the polysilicon film P1.

Figure 18:
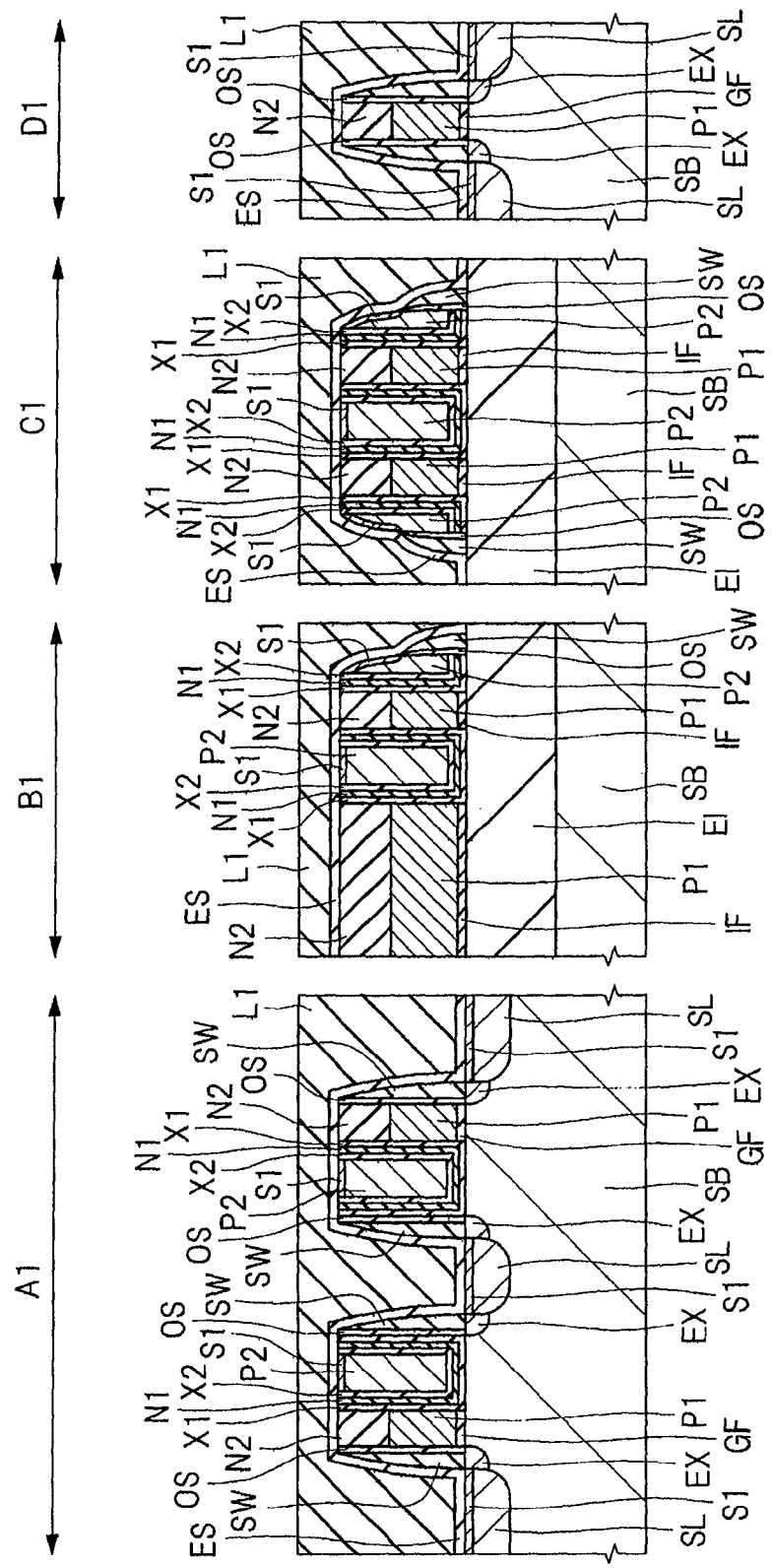
FIG. 18 is a cross-sectional view showing a method for manufacturing the semiconductor device following FIG. 17.

Then, as shown in FIG. 18, entirely over the top surface of the semiconductor substrate SB, using a CVD method or the like, an etching stopper film ES formed of, for example, a silicon nitride film, and an interlayer insulation film L1 formed of, for example, a silicon oxide film are sequentially formed.

Figure 19:
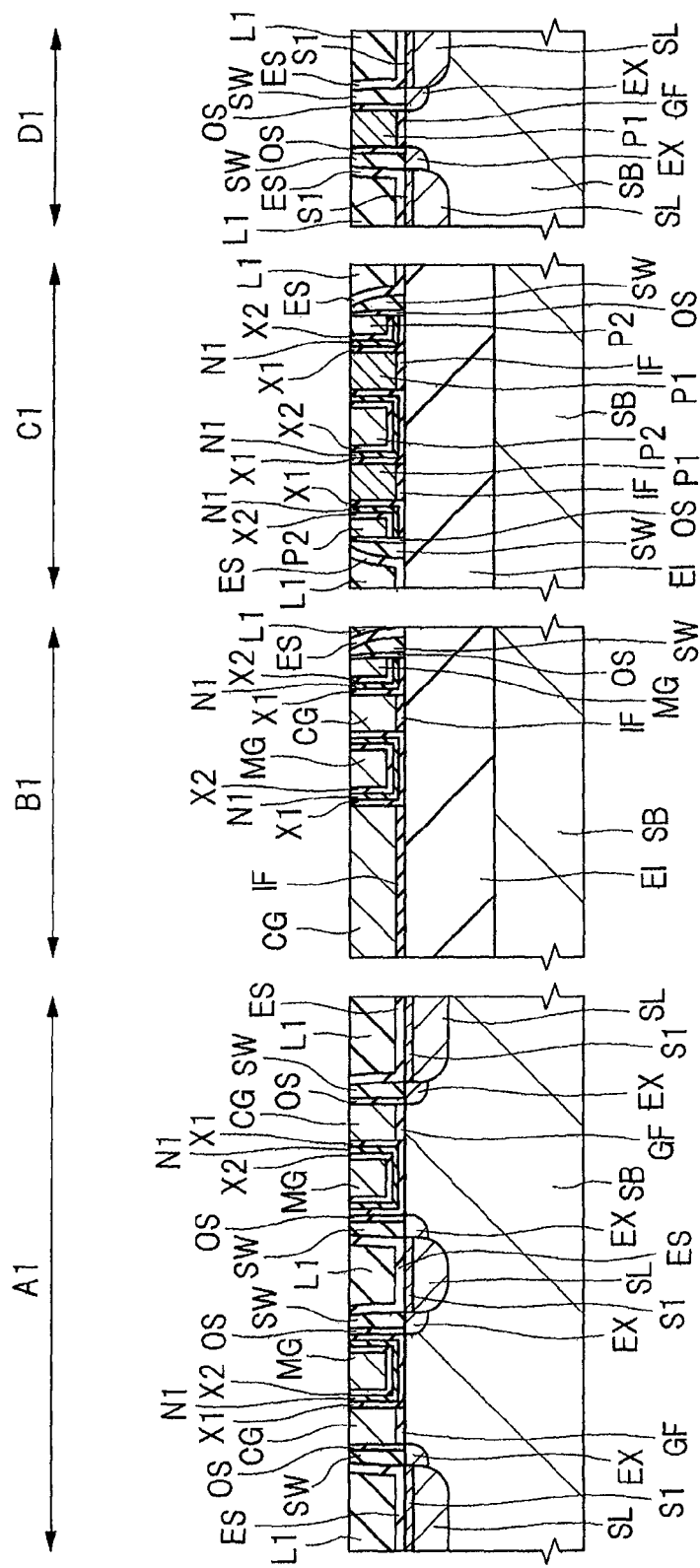
FIG. 19 is a cross-sectional view showing a method for manufacturing the semiconductor device following FIG. 18.

Then, as shown in FIG. 19, using, for example, a CMP (Chemical Mechanical Polishing) method, the top surface of the structure over the semiconductor substrate SB is polished to be retreated. Specifically, the interlayer insulation film L1, the etching stopper film ES, the silicide layer S1, the silicon oxide films X1 and X2, the silicon nitride films N1 and N2, the polysilicon films P1 and P2, the offset spacer OS, and the sidewalls SW are polished. As a result, the top surface heights of respective polished films become equal at a given height equal to or lower than the top surface height of the polysilicon film P2 before the polishing step, and higher than those of the base surfaces of the polysilicon films P1 and P2, for planarization. As a result, the silicide layer S1 over the polysilicon film P2 is removed, and the top surfaces of the polysilicon films P1 and P2 are exposed.

By the polishing step, in the MONOS memory formation region A1 and the feeding part formation region B1, control gate electrodes CG each formed of the polysilicon film P1 are formed, respectively, and memory gate electrodes MG each formed of the polysilicon film P2 are formed, respectively. Incidentally, the control gate electrode CG and the memory gate electrode MG in the feeding part formation region B1 are not a conductive layer functioning as a gate electrode of an n channel type FET (Field Effect Transistor) forming the MONOS memory formed later. The control gate electrode CG and the memory gate electrode MG in the feeding part formation region B1 are each a conductive layer to be used for supplying a prescribed potential to the control gate electrode CG and the memory gate electrode MG in the MONOS memory formation region A1.

As a result, in the MONOS memory formation region A1, there is formed a MONOS memory including the gate insulation film GF, the control gate electrode CG, the ONO film, the memory gate electrode MG, the extension regions EX, and the diffusion layers SL. The ONO film includes the silicon nitride film N1 which is a charge accumulation film for storing information, and the silicon oxide films X1 and X2 for insulating the silicon nitride film N1 from the control gate electrode CG, the memory gate electrode MG, and the semiconductor substrate SB. The MONOS memory is a nonvolatile memory capable of storing information by accumulating electric charges in the silicon nitride film N1 immediately under the memory gate electrode MG. The methods for injecting and extracting electric charges into and from the silicon nitride film N1 include two methods. One is the method in which electrons are injected into and extracted from the entire surface of the silicon nitride film N1 under the memory gate electrode MG by a tunneling current, thereby to perform writing and erasing. Another method is the method using hot carriers.

The MONOS memory has a split gate type structure having a memory gate electrode MG adjacent to a control gate electrode CG via an ONO film. Incidentally, in the MONOS memory formation region A1, a pair of MONOS memories are formed with the region where the dummy gate electrode DP (see FIG. 11) was formed interposed therebetween. The pair of MONOS memories have a source/drain region (which is herein assumed to be a source region) formed in the top surface of the semiconductor substrate SB therebetween in common.

Whereas, by the polishing step, in the feeding part formation region B1, there is formed a feeding part having a control gate electrode CG and a memory gate electrode MG insulated from each other via an ONO film. As described above, the feeding part has the control gate electrode CG and the memory gate electrode MG for supplying a prescribed electric potential to the control gate electrode CG and the memory gate electrode MG of the MONOS memory, respectively. To the top surfaces of the control gate electrode CG and the memory gate electrode MG forming the feeding part, a contact plug formed in a later step is coupled via a silicide layer (not shown).

Further, by the polishing step, in the capacitive element formation region C1, there is formed a PIP (Poly-Insulator-Poly) capacitive element including the polysilicon films P1 and P2 insulated from each other via the ONO film. The PIP capacitive element can be allowed to function as a capacitive element by generating a capacity between the polysilicon film P1 and the polysilicon film P2 insulated from each other via the ONO film.

It can be considered that, as the structure of the capacitive element, there is used a structure in which over a polysilicon film, another polysilicon film is stacked via an insulation film in the direction perpendicular to the main surface of the semiconductor substrate. In contrast, in the present embodiment, different polysilicon films P1 and P2 are arranged in the direction along the top surface of the semiconductor substrate SB, and are insulated from each other by the ONO film, thereby to form the PIP capacitive element. The PIP capacitive element of the present embodiment is not of a structure in which different polysilicon films are stacked in the direction perpendicular to the main surface of the semiconductor substrate. Accordingly, the height of the element can be reduced, and further, the height of the element can be made equal to those of other memory elements, FET, or the like. Therefore, miniaturization of the semiconductor device can be made easy. Thus, the heights of respective top surfaces of the polysilicon films P1 and P2 forming the PIP capacitive element, and generating a capacity therebetween are the same as the heights of respective top surfaces of the control gate electrode CG and the memory gate electrode MG forming the MONOS memory.

Figure 20:
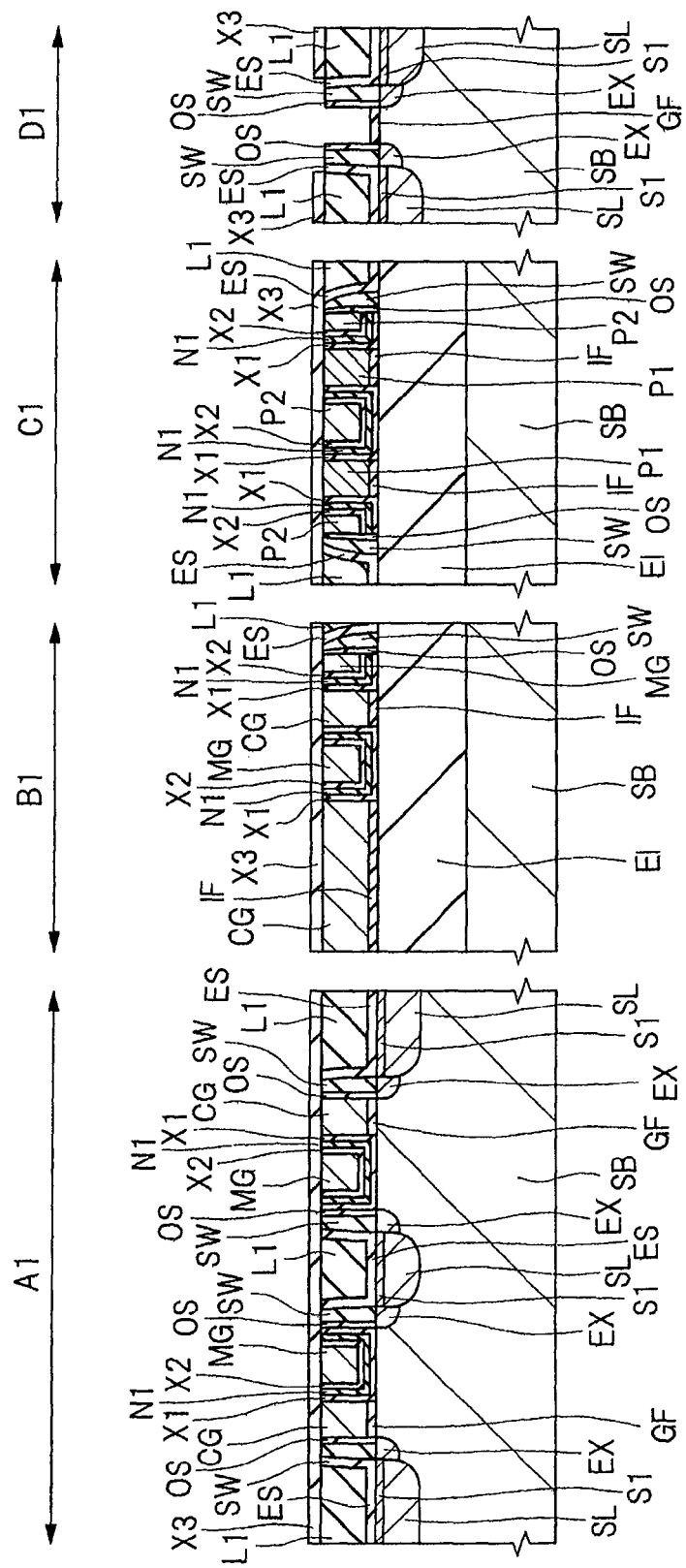
FIG. 20 is a cross-sectional view showing a method for manufacturing the semiconductor device following FIG. 19.

Then, as shown in FIG. 20, using, for example, a CVD method, a silicon oxide film X3 is formed entirely over the top surface of the semiconductor substrate SB. Then, using a photolithography technology and a dry etching method, the silicon oxide film X3 is processed. As a result, the top surface of the polysilicon film P1 in the low breakdown voltage element formation region D1 is exposed from the silicon oxide film X3. Subsequently, using a wet etching method with the silicon oxide film X3 as a mask, the polysilicon film P1 in the low breakdown voltage element formation region D1 is removed. As a result, the gate insulation film GF immediately under the polysilicon film P1 is exposed. Herein, a description was given to the case where when the polysilicon film P1 was removed, the wet etching method was used in order to avoid the underlying film from being damaged. However, the polysilicon film P1 may be removed by a dry etching method.

Incidentally, the film thickness of the gate insulation film GF in the low breakdown voltage element formation region D1 may be increased by performing a heat treatment after removing the polysilicon film P1 in the low breakdown voltage element formation region D1, or by other procedures.

Figure 21:
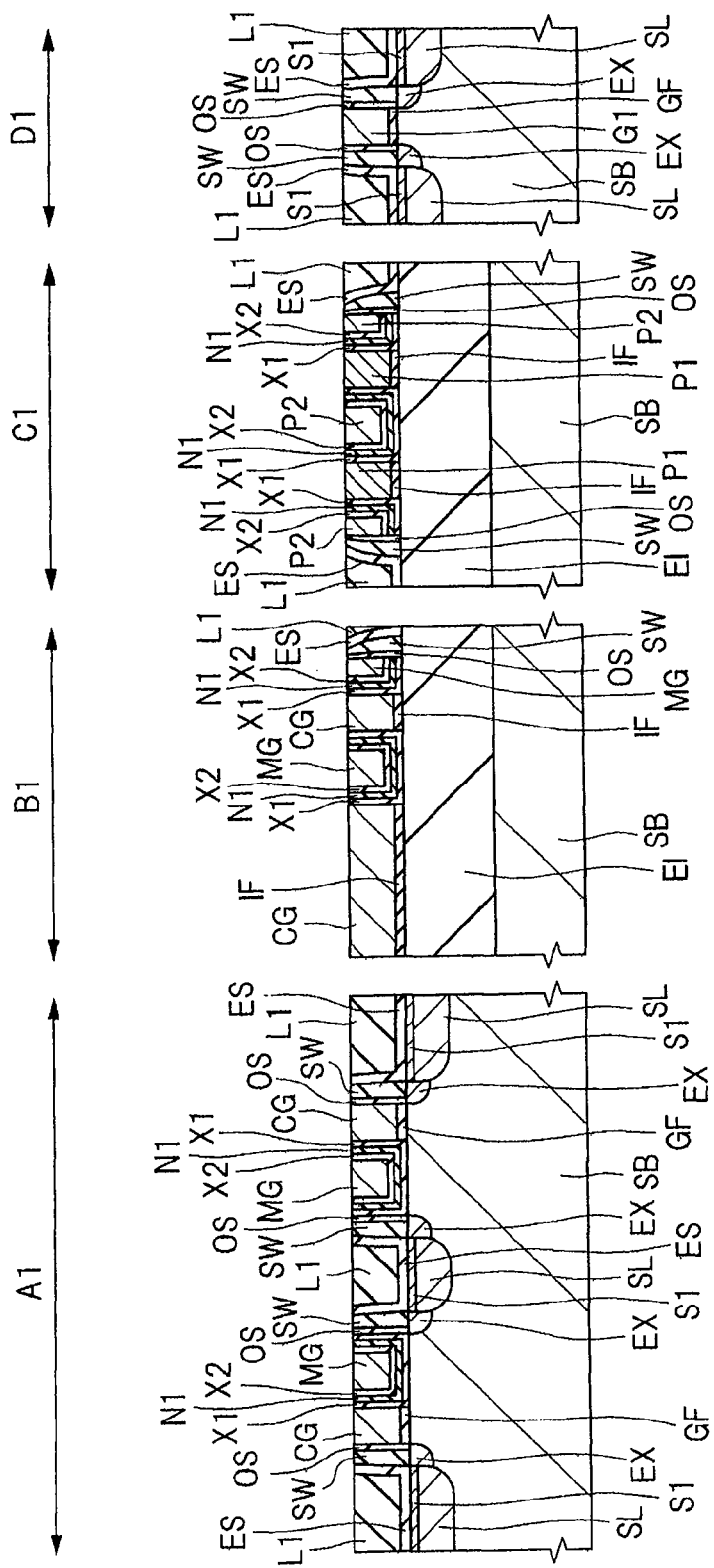
FIG. 21 is a cross-sectional view showing a method for manufacturing the semiconductor device following FIG. 20.

Then, as shown in FIG. 21, the silicon oxide film X3 is etched back, or is subjected to other processings, to be removed. Then, using, for example, a sputtering method, entirely over the top surface of the semiconductor substrate SB, there is formed a metal film formed of, for example, titanium nitride (TiN), aluminum (Al), or tantalum nitride (TaN). As a result, in the step described by reference to FIG. 20, the metal film is fully embedded in the trench formed in the region from which the polysilicon film P1 was removed in the low breakdown voltage element formation region D1.

Subsequently, using a CMP method or the like, the excess portions of the metal film are removed, thereby to expose respective top surfaces of the polysilicon films P1 and P2, the control gate electrode CG, the memory gate electrode MG, the interlayer insulation film L1, and the etching stopper film ES. As a result, over the gate insulation film GF in the low breakdown voltage element formation region D1, there is formed a gate electrode G1 formed of the metal film. By the polishing step with the CMP method, the height of the top surface of the gate electrode G1 is equal to the height of each top surface of the polysilicon films P1 and P2, the control gate electrode CG, the memory gate electrode MG, the interlayer insulation film L1, and the etching stopper film ES.

This results in the formation of an n channel type low breakdown voltage MOSFET (Metal Oxide Semiconductor Field Effect Transistor) including the gate electrode G1, the diffusion layers SL, and the extension regions EX in the low breakdown voltage element formation region D1. The MOSFET is an element driven at a lower voltage than with the MONOS memory, and is used for switching or the like, in a logic circuit or the like.

Figure 22:
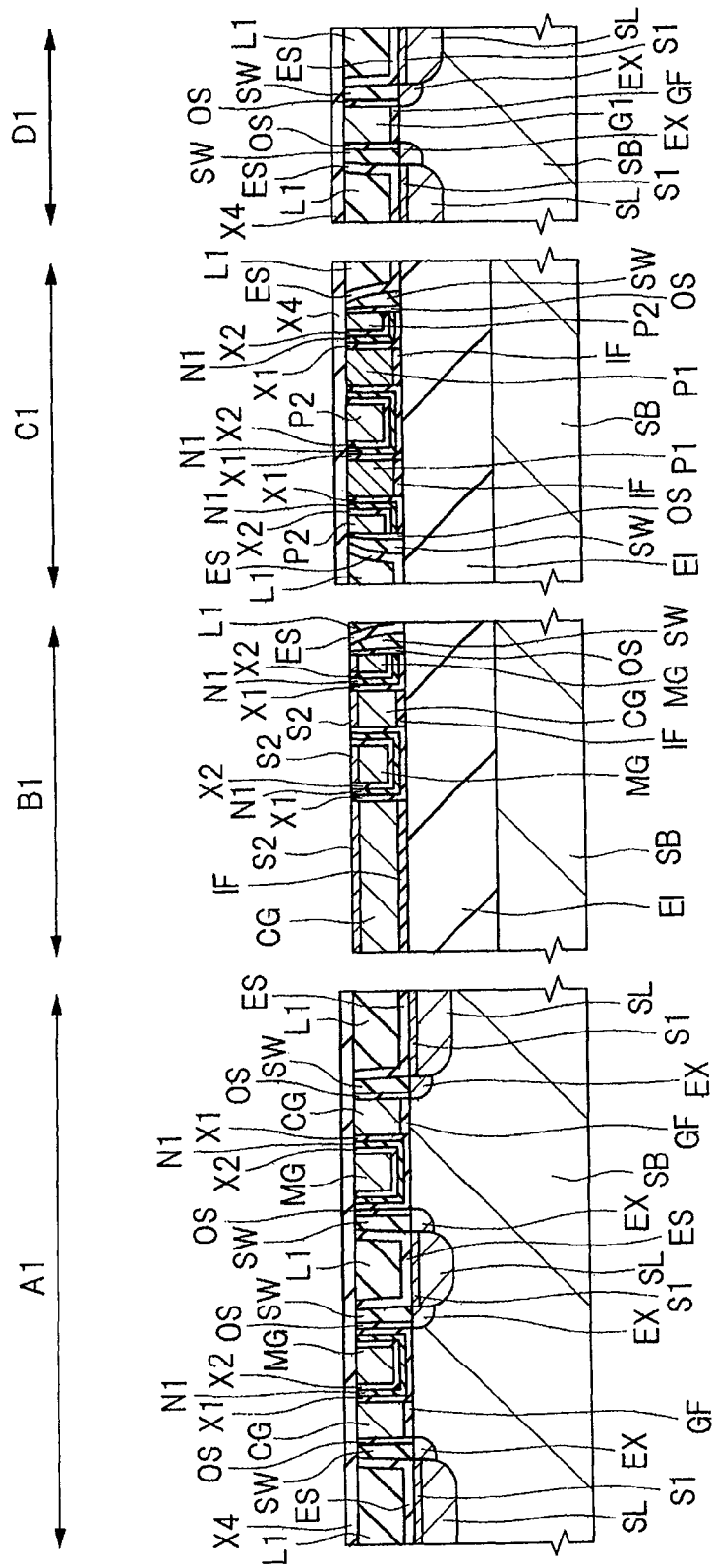
FIG. 22 is a cross-sectional view showing a method for manufacturing the semiconductor device following FIG. 21.

Then, as shown in FIG. 22, using, for example, a CVD method, entirely over the top surface of the semiconductor substrate SB, there is formed a silicon oxide film X4. Then, using a photolithography technology and a dry etching method, the silicon oxide film X4 is processed. As a result, respective top surfaces of the control gate electrode CG and the memory gate electrode MG in the feeding part formation region B1 are exposed from the silicon oxide film X4. Subsequently, using a known salicide technology, over each top surface of the control gate electrode CG and the memory gate electrode MG in the feeding part formation region B1, there is formed a silicide layer S2 formed of, for example, a cobalt silicide (CoSi). The silicide layers S1 and S2 are each a conductive layer disposed for reducing the contact resistance when the contact plug formed in a later step and the diffusion layer SL, the control gate electrode CG, the memory gate electrode MG, and the polysilicon films P1 and P2 are electrically coupled.

Incidentally, in the cross-sectional view shown in FIG. 22, in the capacitive element formation region C1, the silicide layer S2 is not formed. However, in the region not shown in FIG. 22, as described later by reference to FIG. 25, the silicide layer S2 is formed over the polysilicon films P1 and P2 forming the capacitive element. Whereas, to the control gate electrode CG and the memory gate electrode MG in the MONOS memory formation region A1 of FIG. 22, an eclectic potential is supplied from the control gate electrode CG and the memory gate electrode MG in the feeding part formation region B1. Accordingly, the silicide layer S2 is not formed over respective top surfaces of the control gate electrode CG and the memory gate electrode MG in the MONOS memory formation region A1.

Figure 23:
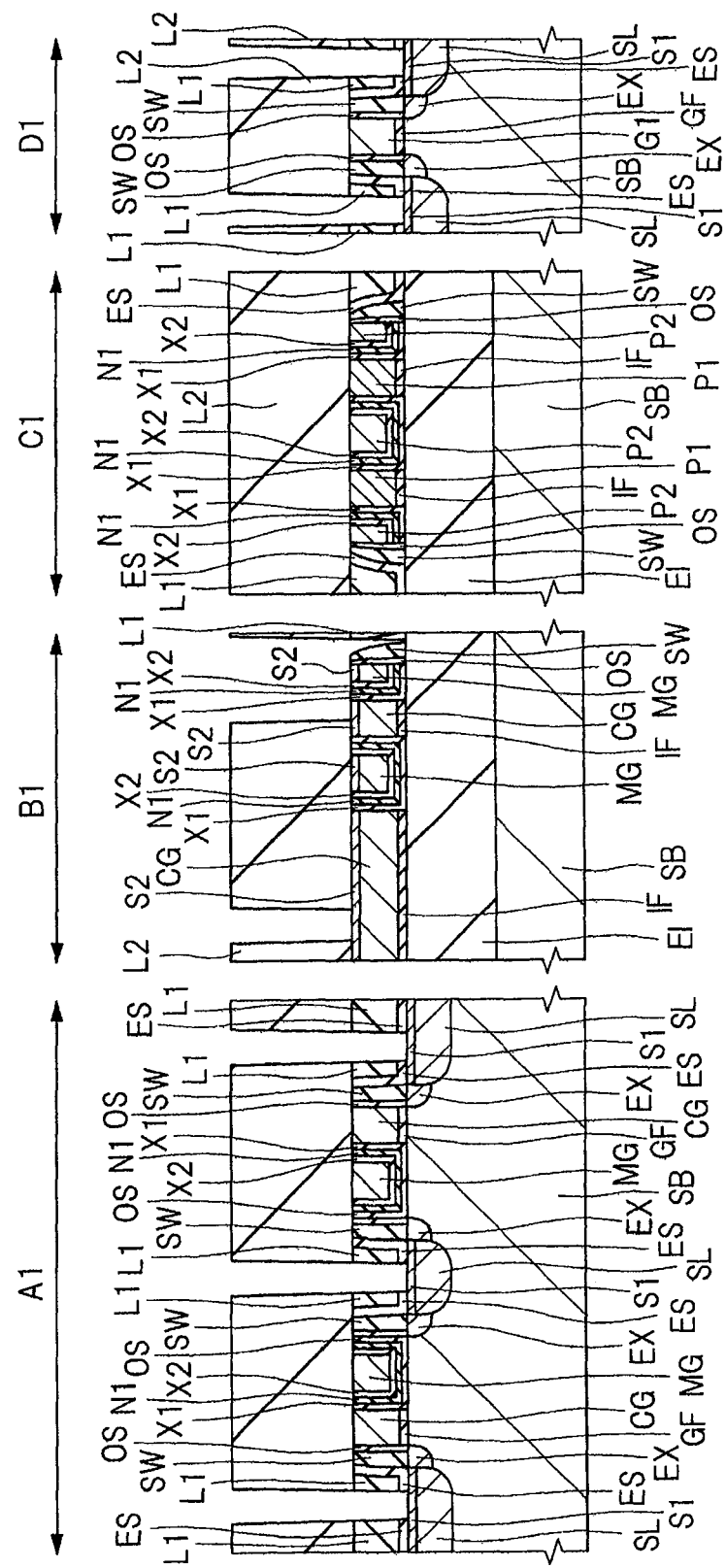
FIG. 23 is a cross-sectional view showing a method for manufacturing the semiconductor device following FIG. 22.

Then, as shown in FIG. 23, after removing the silicon oxide film X4, entirely over the top surface of the semiconductor substrate SB, an interlayer insulation film L2 formed of, for example, a silicon oxide film is formed using a CVD method or the like. As a result, the interlayer insulation film L2 covers the top surfaces of the interlayer insulation film L1, the etching stopper film ES, the sidewalls SW, the offset spacers OS, the control gate electrode CG, the memory gate electrodes MG, the silicon oxide films X1 and X2, the silicon nitride film N1, the silicide layer S2, and the polysilicon films P1 and P2.

Subsequently, using a photolithography technology and a dry etching method, there are formed a plurality of contact holes penetrating the interlayer insulation film L1, and a plurality of contact holes penetrating the interlayer insulation films L1 and L2 and the etching stopper film ES.

In the MONOS memory formation region A1, each contact hole penetrating the interlayer insulation films L1 and L2 and the etching stopper film ES is opened. As a result, the top surface of the silicide layer S1 at the top surface of the diffusion layer SL is exposed. In the feeding part formation region B1, the contact hole penetrating the interlayer insulation film L1 is opened, thereby to expose the top surface of the silicide layer S2 at the top surface of the control gate electrode CG. Whereas, the contact hole penetrating the interlayer insulation films L1 and L2 and the etching stopper film ES is opened, thereby to expose the top surface of the silicide layer S2 at the top surface of the memory gate electrode MG formed in a sidewall shape. The contact hole exposing the silicide layer S2 over the sidewall-shaped memory gate electrode MG at the end of feeding part may expose the silicide layer S2 over the top surface of the control gate electrode CG adjacent to the memory gate electrode MG, and surrounded by the memory gate electrode MG in plan view.

In the capacitive element formation region C1, in the region not shown in FIG. 23, a contact hole penetrating the interlayer insulation film L1 is opened, thereby to expose respective top surfaces of the polysilicon films P1 and P2. In the low breakdown voltage element formation region D1, each contact hole penetrating the interlayer insulation films L1 and L2 and the etching stopper film ES is opened, thereby to expose the top surface of the silicide layer S1 at the top surface of the diffusion layer SL. Further, in the region not shown, a contact hole penetrating the interlayer insulation film L1 is opened, thereby to expose the top surface of the gate electrode G1.

Figure 24:
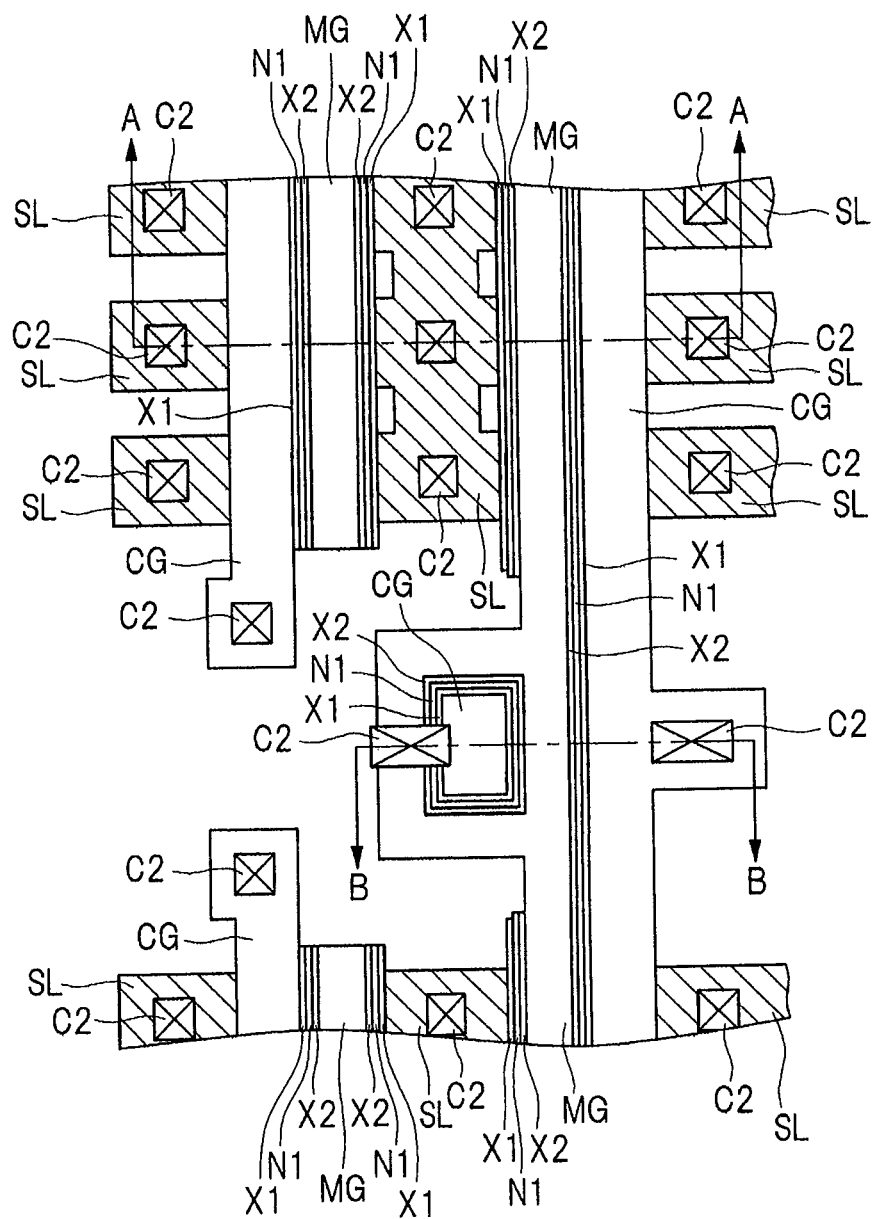
FIG. 24 is a plane layout showing a method for manufacturing the semiconductor device following FIG. 23.
Figure 25:
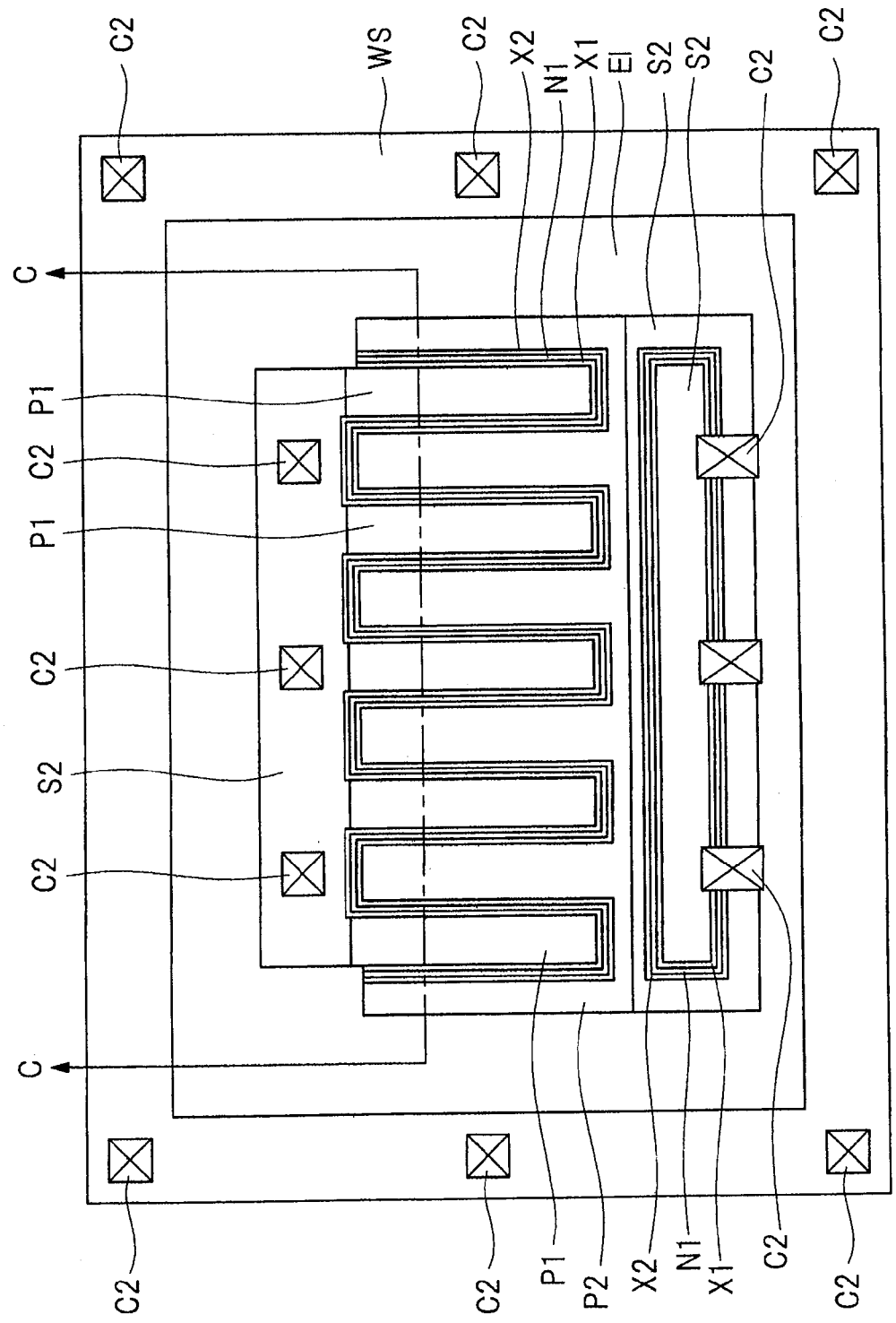
FIG. 25 is a plane layout showing a method for manufacturing the semiconductor device following FIG. 23.
Figure 26:
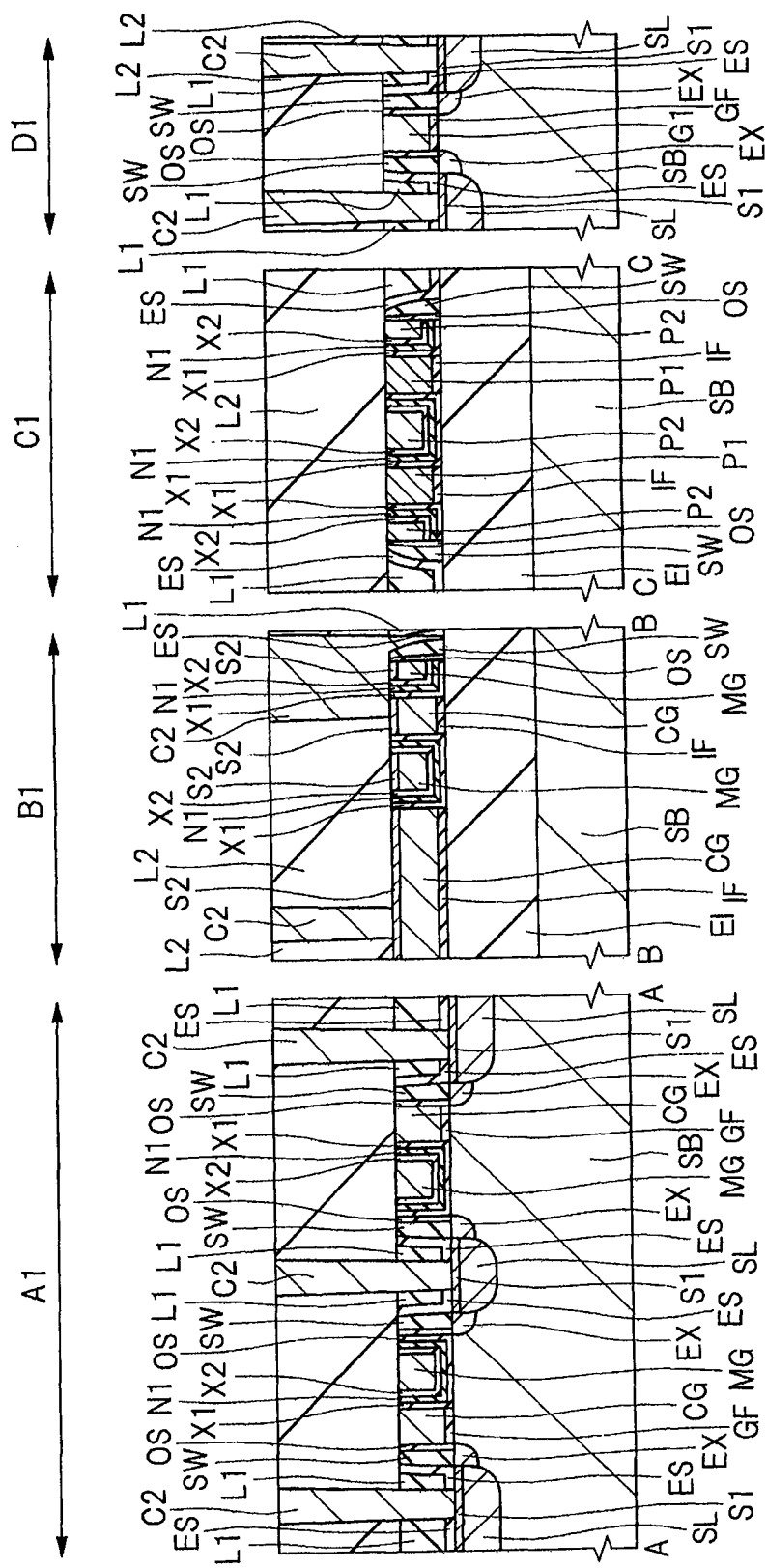
FIG. 26 is a cross-sectional view showing a method for manufacturing the semiconductor device following FIG. 23.

Then, as shown in FIGS. 24, 25, and 26, in each inside of the plurality of contact holes, there is formed a contact plug (coupling member) C2 including, for example, mainly, W (tungsten), resulting in the completion of the semiconductor device of the present embodiment. FIG. 24 is a plane layout showing, as with FIG. 10, the formation region of the MONOS memory and the formation region of the feeding part of the MONOS memory of the semiconductor device during a manufacturing step. The MONOS memory formation region A1 of FIG. 26 is a cross section along line A-A of FIG. 24. The feeding part formation region B1 of FIG. 26 is a cross section along line B-B of FIG. 24. Further, FIG. 25 is a plane layout showing, as with FIGS. 6 and 9, the formation region of the capacitive element of the semiconductor device during a manufacturing step. The capacitive element formation region C1 of FIG. 26 is a cross section along line C-C of FIG. 25.

Each of the plurality of contact plugs C2 is a conductor formed for supplying a prescribed electric potential to the diffusion layer SL, the control gate electrode CG, the memory gate electrode MG, the polysilicon films P1 and P2, and the gate electrode G1.

When each contact plug C2 is formed, first, entirely over the top surface of the semiconductor substrate SB, a barrier metal film (not shown) is formed using a sputtering method or the like. Thus, the surface in the contact hole is covered with the barrier metal film. Thereafter, a tungsten film is formed using a sputtering method or the like, and fully fills each inside of the plurality of contact holes. Subsequently, using a CMP method or the like, excess portions of the barrier metal film and the tungsten film over the interlayer insulation film L2 are removed, thereby to expose the top surface of the interlayer insulation film L2. Accordingly, the top surfaces of the interlayer insulation film L2 and the tungsten film are planarized. As a result, the contact plug C2 formed of the barrier metal film and the tungsten film is formed in each contact hole.

As shown in the feeding part formation region B1 of FIG. 26, the contact plug C2 coupled onto the memory gate electrode MG formed in a sidewall shape via the silicide layer S2 may be electrically coupled to the control gate electrode CG adjacent to the memory gate electrode MG via the silicide layer S2. The control gate electrode CG is not electrically coupled with the control gate electrode CG in the MONOS memory formation region A1. As shown in the feeding part of the FIG. 24, the control gate electrode CG is surrounded at the periphery thereof by the memory gate electrode MG in plan view, and is electrically isolated.

Thus, when the contact plug C2 is electrically coupled to the memory gate electrode MG, the contact plug C2 is formed in such a manner as to also cover the top surface of the isolated control gate electrode CG. This is due to the fact that the memory gate electrode MG is formed in a sidewall shape in a self-aligned manner. Namely, the area of the top surface of the memory gate electrode MG, namely, the area in plan view is small. For this reason, it is difficult to couple the contact plug C2 to only the memory gate electrode MG with high precision and with reliability. Thus, herein, the control gate electrode CG electrically insulated from the MONOS memory is formed, and the contact plug C2 with a large width extending over the control gate electrode CG is formed over the memory gate electrode MG. As a result, the reliability of feeding to the memory gate electrode MG is enhanced.

Such a configuration is also used for the site at which the contact plug C2 is electrically coupled to the polysilicon film P2 formed in a sidewall shape as shown in FIG. 25.

Incidentally, in FIG. 25, in addition to the polysilicon films P1 and P2, there is also shown the silicide layer S2 formed at each top of the polysilicon films P1 and P2. The contact plug C2 is coupled to the silicide layer S2, and thereby is electrically coupled to the polysilicon film P1 or P2 immediately under the silicide layer S2.

The contact plug C2 for supplying an electric potential to the polysilicon film P2 is formed across the silicide layer S2 over the polysilicon film P2, and the silicide layer S2 isolated from the polysilicon film P1 for generating a capacity in the PIP capacitive element, and immediately over the polysilicon film P1 (not shown) surrounded by the polysilicon film P2 in plan view. As a result, as with the memory gate electrode MG (see FIG. 24), the contact plug C2 can be surely coupled to the polysilicon film. P2 formed in a sidewall shape, and having a small width in plan view.

Incidentally, as shown in FIG. 25, in other regions than the region for performing feeding to each of the polysilicon films P1 and P2, namely, in the region where the polysilicon films P1 and P2 are adjacent to each other via an ONO film for generating a capacity, no silicide layer S2 is formed. This is for preventing the occurrence of the following: when the silicide layer S2 is formed at each top of the polysilicon films P1 and P2, the polysilicon films P1 and P2 close to each other via the ONO film formed of the silicon oxide films X1 and X2 and the silicon nitride film N2 are short-circuited due to the contact between their respective overlying silicide layers S2. Therefore, in the region where the plurality of polysilicon films P1 extending in the second direction, and the plurality of polysilicon films P2 extending in the second direction are alternately arranged in the first direction, namely, the region for generating a capacity, no silicide layer S2 is formed at each top of the polysilicon films P1 and P2 (see FIG. 22).

Further, to the pattern extending in the first direction of the patterns of the polysilicon film P1, there is coupled the contact plug C2 for supplying an electric potential to the polysilicon film P1. Over the pattern of the polysilicon film P1 extending in the first direction, the silicide layer S2 is formed between the pattern and the contact plug C2.

Herein, in the step described by reference to FIG. 8, the polysilicon film P2 in the capacitive element formation region C1 not shown in FIG. 8 is partially not removed. This results in that, as shown in FIG. 6, the polysilicon film P2 is left adjacent to the pattern extending in the first direction of the polysilicon film P1 having a comb type shape. In this case, the silicide layer S2 is formed at each top surface of the pattern extending in the first direction, and the polysilicon film P2 adjacent thereto. This may result in that the polysilicon films P1 and P2 are short-circuited due to the contact between their respective overlying silicide layers S2. In order to avoid this, in the present embodiment, in the step described by reference to FIG. 8, the polysilicon film P2 in the capacitive element formation region C1 is partially removed. As a result, it becomes possible to prevent the short circuit between the polysilicon films P1 and P2. Further, it is possible to prevent the short circuit between the polysilicon films P1 and P2 due to the misalignment in forming the contact hole when the contact plug C2 is coupled onto the comb type polysilicon film P1.

In FIG. 25, there is shown a well feeding part WS formed in the top surface of the semiconductor substrate SB (not shown) for supplying an electric potential to the well formed in the top surface of the semiconductor substrate SB. The well feeding part WS is formed in a ring shape in such a manner as to surround the element isolation region EI including the PIP capacitive element formed at the top thereof in plan view by ion planting, for example, P type impurities (e.g., B (boron)) into the top surface of the semiconductor substrate SB. At the top surface of the well feeding part WS, there is formed a silicide layer S1 (not shown). Over the well feeding part WS, the contact plug C2 is formed via the silicide layer S1. An electric potential is supplied to the semiconductor substrate SB via the contact plug C2, the silicide layer S1, and the well feeding part WS. As a result, it is possible to fix the electric potential of the semiconductor substrate SB at the underlying part of the PIP capacitive element.

As shown in FIG. 24, in the region including the MONOS memory formed therein, as distinct from FIG. 10, the dummy gate electrode DP has been removed. In the top surface of the semiconductor substrate SB (see FIG. 26) immediately under the region where the dummy gate electrode DP was formed, there is formed a diffusion layer SL forming a source/drain region. Incidentally, in FIG. 24, for easy understanding of the drawing, the silicide layers S1 and S2 are not shown. The silicide layer S2 is not formed at each top surface of the memory gate electrode MG and the control gate electrode CG forming the MONOS memory. However, in the feeding part, the silicide layer S2 (not shown) is formed between the memory gate electrode MG and the control gate electrode CG, and their overlying contact plug C2.

Below, a description will be given to the effects of the method for manufacturing a semiconductor device of the present embodiment.

Figure 32:
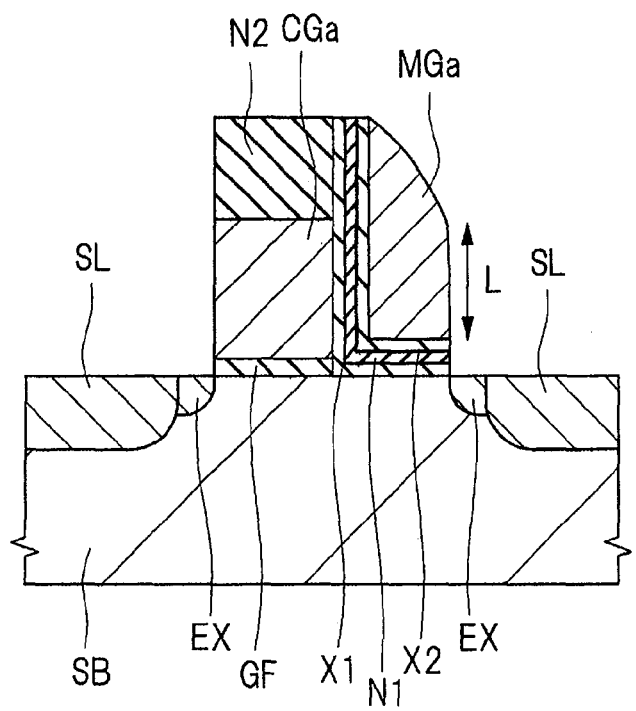
FIG. 32 is a cross-sectional view showing a method for manufacturing a semiconductor device which is Comparative Example.
Figure 33:
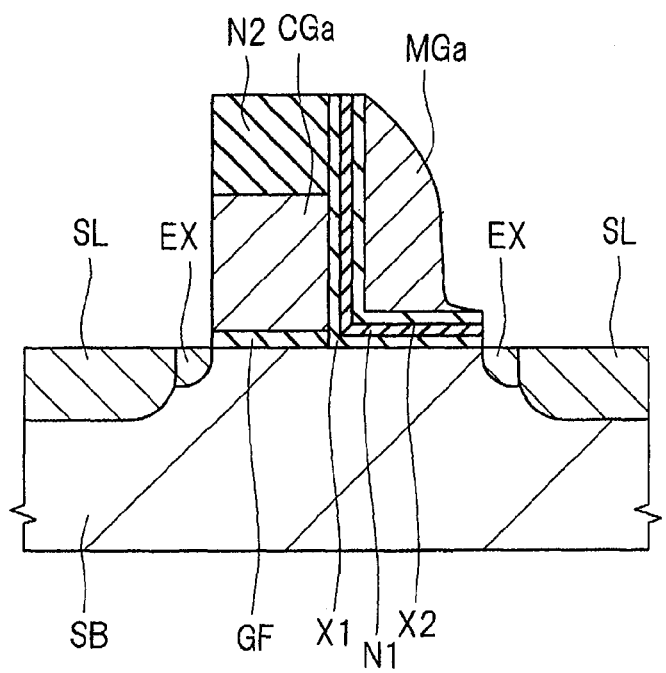
FIG. 33 is a cross-sectional view showing a method for manufacturing a semiconductor device which is Comparative Example.

As the structure of a split gate type MONOS memory, conceivably, as shown in FIGS. 32 and 33, over the semiconductor substrate SB, a control gate electrode CGa is formed via a gate insulation film GF; and over one or both of the sidewalls thereof, there is formed a memory gate electrode MGa formed in a sidewall shape in a self-alignment manner via an ONO film. The ONO film is a lamination film including a silicon oxide film X1, a silicon nitride film N1, and a silicon oxide film X2 sequentially formed therein. The silicon nitride film N1 is an insulation film functioning as a charge accumulation film of the MONOS memory.

FIGS. 32 and 33 are each a cross-sectional view showing a semiconductor device including a MONOS memory as a comparative example. Herein, in addition to the control gate electrode CGa and the memory gate electrode MGa, there are shown a silicon nitride film N2 over the control gate electrode CGa, and source/drain regions each formed of an extension region EX and a diffusion layer SL formed in the top surface of the semiconductor substrate SB. Incidentally, the following configuration is also acceptable: the silicon nitride film N2 is not formed, and the height of the top surface of the control gate electrode CGa and the height of each uppermost surface of the ONO film and the memory gate electrode MGa are equal.

The memory gate electrode MGa shown in FIGS. 32 and 33 is formed in the following manner. Over the semiconductor substrate SB, a pattern of a lamination film formed of the control gate electrode CGa and the silicon nitride film N2 is formed via the gate insulation film GF. Then, over the semiconductor substrate SB, an ONO film and a polysilicon film covering the lamination film is formed (deposited) by a CVD method or the like. Subsequently, by a dry etching method, the polysilicon film is partially removed. In other words, a portion of the polysilicon film is left in a self-alignment manner in a sidewall shape over the sidewall of the control gate electrode CGa. This results in the formation of the memory gate electrode MGa formed of the polysilicon film.

In the comparative example, the memory gate electrode MGa is formed in a sidewall shape. Accordingly, in the gate length direction of the control gate electrode CGa, the height of the top surface of the memory gate electrode MGa decreases with an increase in distance from the sidewall of the control gate electrode CGa. The lowest height (film thickness) of the end of the memory gate electrode MGa in this case is referred to as L as shown in FIG. 32. Miniaturization of the MONOS memory having the memory gate electrode MGa in such a shape leads to the following: in the ion implantation step performed for forming source/drain regions and the like after the formation of the memory gate electrode MGa, injected impurities penetrate the memory gate electrode MGa, and are implanted into the top surface of the semiconductor substrate SB. In this case, needless impurity ions are implanted into the top surface of the semiconductor substrate SB, resulting in changes in characteristics of the MONOS memory, namely, the erasing characteristic and the writing characteristic of information. This unfavorably reduces the reliability of the semiconductor device.

In order to prevent the penetration of the impurity ions, the memory gate electrode MGa is required to have a prescribed height (film thickness) X. Thereagainst, the height of the memory gate electrode MGa is not constant, and the height (film thickness) L of one end in the gate length direction is lower. In other words, with the semiconductor device of the comparative example shown in FIG. 32, it is not possible to miniaturize the MONOS memory while keeping the height X required for preventing the impurity ions from penetrating the memory gate electrode MGa.

Namely, even when the MONOS memory is tried to be miniaturized so that the height (film thickness) L of one end of the memory gate electrode MGa holds the height (film thickness) X capable of preventing the penetration of impurity ions, the memory gate electrode MGa is formed in a self-alignment manner, so that the height of the uppermost surface of the memory gate electrode MGa is higher than the height L of the top surface of one end. Whereas, the height of the top surface of the lamination film adjacent to the sidewall of the memory gate electrode MGa via the ONO film, namely, the lamination film including the control gate electrode CGa is higher than the height L of the top surface of the end of the memory gate electrode MGa. For this reason, the height of each uppermost surface of the memory gate electrode MGa and the lamination film adjacent to the memory gate electrode MGa cannot be reduced down to the height enough to prevent impurity ions from penetrating the memory gate electrode MGa.

Thus, when an attempt is performed to prevent the penetration of impurity ions, miniaturization of the MONOS memory unfavorably becomes difficult due to the fact that the memory gate electrode MGa has a sidewall shape.

Further, as shown in FIG. 33, the shape of the memory gate electrode MGa formed in a self-alignment manner tends to extend with the lower part widening at the bottom thereof in the direction away from the control gate electrode CGa. This tendency becomes more remarkable as the MONOS memory is more miniaturized. The characteristics and the reliability of the MONOS memory are largely affected by the width of the gate length direction of the memory gate electrode MGa, and the perpendicularity thereof.

Incidentally, the perpendicularity herein used means the degree indicating how close to the right angle the angle at which the sidewall of the memory gate electrode MGa is formed with respect to the main surface of the semiconductor substrate SB is. With an increase in perpendicularity of the sidewall of the memory gate electrode MGa, it becomes easier to keep the characteristics of the MONOS memory constant, and to hold the reliability of the MONOS memory. In other words, when the angle formed between the sidewall of the memory gate electrode MGa, on the opposite side to the side thereof at which the memory gate electrode MGa and the control gate electrode CGa are in contact with each other and the semiconductor substrate SB is close to the right angle, it is possible to prevent the reduction of the reliability of the semiconductor device.

However, as described above, when the MONOS memory is miniaturized, the sidewall-shaped memory gate electrode MGa extends at the bottom thereof along the top surface of the semiconductor substrate, resulting in a difficulty in keeping the perpendicularity. Further, the sidewall-shaped memory gate electrode MGa increases in width in the gate length direction with approach from the top surface toward the bottom surface. Accordingly, with an increase in degree of miniaturization of the MONOS memory, it becomes more difficult to form the memory gate electrode MGa while keeping the width constant. For this reason, when the MONOS memory is tried to be miniaturized, it is not possible to hold the perpendicularity of the sidewall-shaped memory gate electrode MGa, and to form the width in the gate length direction at a desired given width. This may result in changes in characteristics of the MONOS memory, and the reduction of the reliability of the semiconductor device.

In contrast, in the present embodiment, there is not used the method in which the polysilicon film formed in a sidewall shape at the sidewall of the control gate electrode is not left as a memory gate electrode. In the present embodiment, as described by reference to FIGS. 5 and 7, the polysilicon film P2 embedded in the trench between the pattern of the polysilicon film P1 to be a control electrode and the pattern of the dummy gate electrode DP forms the memory gate electrode MG (see FIG. 19). Thus, in the step shown in FIG. 7, the polysilicon film P2 formed in a sidewall shape is removed, and is not used as a gate electrode.

The polysilicon film P2 formed by being embedded in the trench as described above does not have such a cross-sectional shape as to more change in height and width thereof with an increase in distance from the control gate electrode CGa as with the memory gate electrode MGa of the comparative example (see FIG. 32). As shown in FIG. 26, the cross-sectional shape of the memory gate electrode MG is a rectangle.

Therefore, in the manufacturing step of the semiconductor device of the present embodiment, the height of the top surface of one memory gate electrode MG can be set constant in any region, and the width in the gate length direction of the memory gate electrode MG can also be set constant at any height. Thus, the perpendicularity of the sidewall can be enhanced. In other words, one memory gate electrode MG does not decrease in film thickness with an increase in distance from the adjacent control gate electrode CG, and is uniform in film thickness. Further, the sidewall of the memory gate electrode MG on the side thereof not in contact with the control gate electrode CG is formed perpendicular to the main surface of the semiconductor substrate SB.

For this reason, even when the MONOS memory is miniaturized, the memory gate electrode MG is not excessively reduced in height at the end thereof. This can prevent impurity ions from penetrating the memory gate electrode MG in the ion implantation step performed for forming source/drain regions or in other cases. As a result, it becomes possible to prevent the changes in characteristics of the MONOS memory even when the MONOS memory is miniaturized. This can improve the reliability of the semiconductor device.

Further, by adjusting the distance between the polysilicon film P1 and the dummy gate electrode DP shown in FIG. 5, it becomes possible to control the width of the memory gate electrode MG with ease. Further, as distinct from the semiconductor device of the comparative example shown in FIG. 33, the bottom of the memory gate electrode MG can also be prevented from extending in the gate length direction. Accordingly, it becomes possible to prevent the changes in characteristics of the MONOS memory. Thus, the control of the width of the memory gate electrode MG is facilitated, and the enhancement in perpendicularity of the memory gate electrode MG is enabled. As a result, it becomes easy to adjust the characteristics of the MONOS memory, namely, the erasing characteristic and the writing characteristic of information. Therefore, it is possible to improve the reliability of the semiconductor device.

With the semiconductor device formed by the manufacturing method of the present embodiment, it is possible to set the area necessary for one MONOS memory about half as compared with the case where the memory gate electrode is formed in a sidewall shape.

Whereas, in the present embodiment, as shown in FIG. 26, not the PIP capacitive element in which over a polysilicon film, another polysilicon film is stacked via an insulation film, different polysilicon films P1 and P2 are arranged in the direction along the top surface of the semiconductor substrate SB, and an ONO film is interposed between the polysilicon films P1 and P2, thereby to form a capacitive element. Accordingly, as described above, the PIP element can be reduced in height, and can be made equal in height to FET for use in a MONOS memory or a logic circuit, and the like. This enables miniaturization of the semiconductor device.

Further, the PIP capacitive element has, as with the MONOS memory, a structure in which the polysilicon films P1 and P2 are arranged in the direction along the top surface of the semiconductor substrate SB. For this reason, the PIP capacitive element can be formed by the same step as that for the MONOS memory. Therefore, as compared with the case where over a polysilicon film, another polysilicon film is stacked via an insulation film, thereby to form a PIP capacitive element, the manufacturing steps of the semiconductor device can be simplified, which can improve the throughput.

With an element for generating a capacity by opposing comb type patterns to each other as with the PIP capacitive element of the present embodiment, when the element becomes adaptable to the required capacity, the adaptation becomes possible by changing the number, length, or the like of the plurality of patterns of the polysilicon films P1 and P2 extending in the second direction, and alternately arranged in the second direction, namely, the comb teeth.

Second Embodiment

In the First Embodiment, a description was given to the method for manufacturing a semiconductor device, including the step of polishing and removing the silicide layer S1 in the step described by reference to FIG. 19. In contrast, in the present embodiment, a method for manufacturing a semiconductor device in which a silicide layer is not polished in a polishing step will be described below by reference to FIGS. 27 to 31. FIGS. 27 to 31 are each a cross-sectional view showing a semiconductor device in a manufacturing step, for illustrating the method for manufacturing a semiconductor device of the present embodiment.

In the manufacturing step of the semiconductor device of the present embodiment, first, by performing the steps shown in FIGS. 1 to 12 in the First Embodiment, a pattern including the polysilicon films P1 and P2 is formed over the semiconductor substrate SB, and the dummy gate electrode DP (see FIG. 11) is removed.

Figure 27:
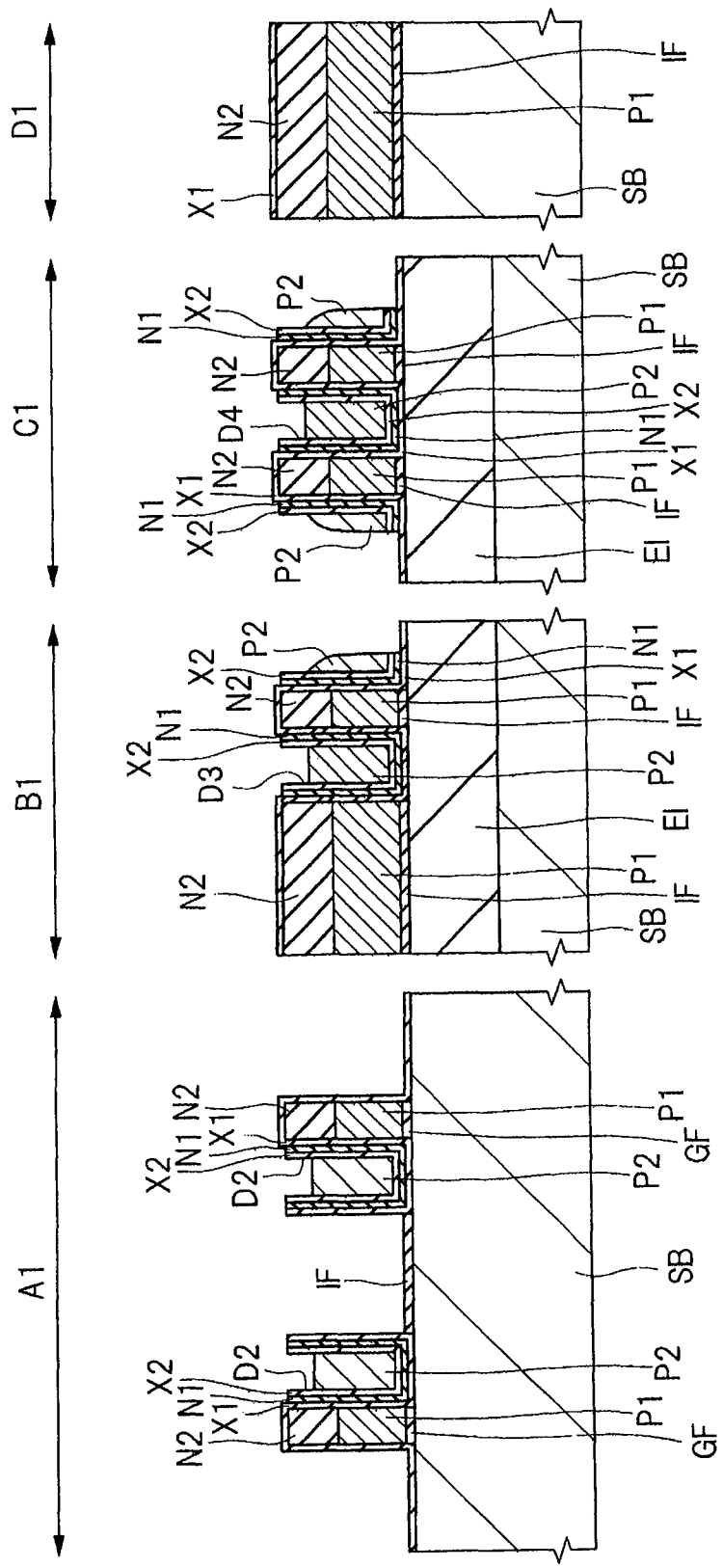
FIG. 27 is a cross-sectional view showing a method for manufacturing a semiconductor device which is Second Embodiment of the present invention.

Then, as shown in FIG. 27, after removing a photoresist film PR4, using a dry etching method, the top surface of the polysilicon film P2 exposed from the silicon oxide film X1 is selectively etched back, and is retreated. As a result, in the MONOS memory formation region A1, the feeding part formation region B1, and the capacitive element formation region C1, trenches D2 to D4 are formed, respectively. In other words, the trench D2 is formed immediately over the polysilicon film P2 in the MONOS memory formation region A1; the trench D3 is formed immediately over the polysilicon film P2 embedded between the adjacent polysilicon films P1 in the feeding part formation region B1; and the trench D4 is formed immediately over the polysilicon film P2 embedded between the adjacent polysilicon films P1 in the capacitive element formation region C1. At each sidewall of the trenches D2 to D4, the sidewall of the silicon oxide film X2 is exposed. At each bottom surface of the trenches D2 to D4, the polysilicon film P2 is exposed.

Further, by the etching back, in the feeding part formation region B1 and the capacitive element formation region C1, the top surface of each polysilicon film P2 formed in a sidewall shape is also retreated.

Incidentally, the height of the top surface of the etched-back polysilicon film P2 is set equal to, or higher than, for example, the top surface of the polysilicon film P1. As a result, the height of the top surface of the polysilicon film P2 becomes lower than the height of the top surface of the ONO film including the silicon oxide film X2, the silicon nitride film N1, and the silicon oxide film X1, in contact with the sidewall thereof.

Figure 28:
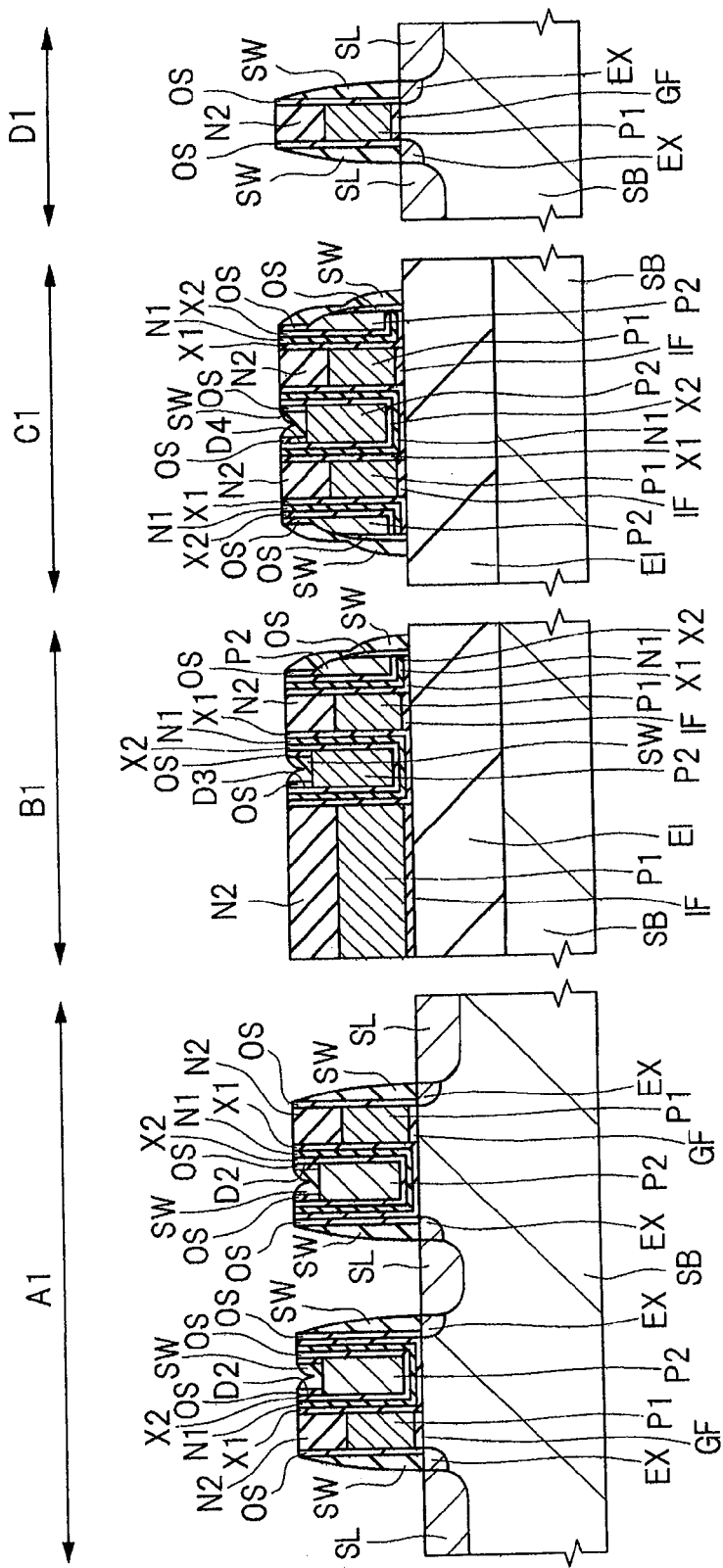
FIG. 28 is a cross-sectional view showing a method for manufacturing the semiconductor device following FIG. 27.

Then, the same steps as those described by reference to FIGS. 13 to 15 are performed, resulting in the structure shown in FIG. 28. Namely, after removing the exposed portions of the silicon oxide film X1, offset spacers OS, extension regions EX, sidewalls SW, and diffusion layers SL are sequentially formed.

However, as distinct from the First Embodiment, the height of the top surface of the polysilicon film P2 is lower than the height of the top surface of the ONO film in contact with the sidewall thereof. For this reason, at each sidewall of the trenches D2 to D4 immediately over the polysilicon film P2, a sidewall SW is formed via an offset spacer OS. Whereas, in the feeding part formation region B1 and the capacitive element formation region C1, at the sidewall of the silicon oxide film X2 immediately over the polysilicon film P2 formed in a sidewall shape, a sidewall SW is formed via an offset spacer OS.

As a result, the top surface of each polysilicon film P2 in the MONOS memory formation region A1, and the top surface of each polysilicon film P2 embedded between the adjacent polysilicon films P1 in the feeding part formation region B1 and the capacitive element formation region C1 are fully covered with the sidewalls SW, and hence are not exposed on the semiconductor substrate SB. Further, in the feeding part formation region B1 and the capacitive element formation region C1, the top surface of the polysilicon film P2 formed in a sidewall shape is also covered with the offset spacer OS and the sidewall SW, and hence is not exposed. In order to obtain such a structure, in the etching back step described by reference to FIG. 27, by the step shown in the subsequent FIG. 28, the top surface height of the polysilicon film P2 is required to be retreated in the direction of the semiconductor substrate SB by the height necessary for the sidewall SW to cover the top surface of the polysilicon film P2.

As the structure for the sidewall SW to fully cover the top surface of the polysilicon film P2, for example, the following structure can be considered. In other words, it can be considered that the length of the polysilicon film p2 in the direction in which the polysilicon film P2 and the polysilicon film P1 are arranged, namely, the gate length direction of the memory gate electrode formed of the polysilicon film P2 in a later step is set equal to or smaller than the length twice the total length of the film thickness of the offset spacer OS and the film thickness of the insulation film forming the sidewall SW. As a result, each width of the trenches D2 to D4 in the same direction is equal to or smaller than the length twice the total length of the film thickness of the offset spacer OS and the film thickness of the insulation film forming the sidewall SW. For this reason, the formation of the sidewalls SW allows each bottom surface of the trenches D2 to D4 to be fully covered with the offset spacers OS and the sidewalls SW formed at the sidewalls on opposite sides of each of the trenches D2 to D4.

Then, the same steps as those described by reference to FIGS. 16 and 17 are performed, resulting in the structure shown in FIG. 29. As a result, at the top surface of the diffusion layer SL, there is formed a silicide layer S1. Herein, as distinct from the First Embodiment, the top surface of the polysilicon film P2 is covered with the sidewall SW. Accordingly, the silicide layer is not formed at each top surface of the polysilicon films P2 in the MONOS memory formation region A1, the feeding part formation region B1, and the capacitive element formation region C1. In other words, the silicide layer S1 is herein formed at only the exposed portions of the top surface of the semiconductor substrate SB, including the diffusion layer SL, and the like.

Figure 30:
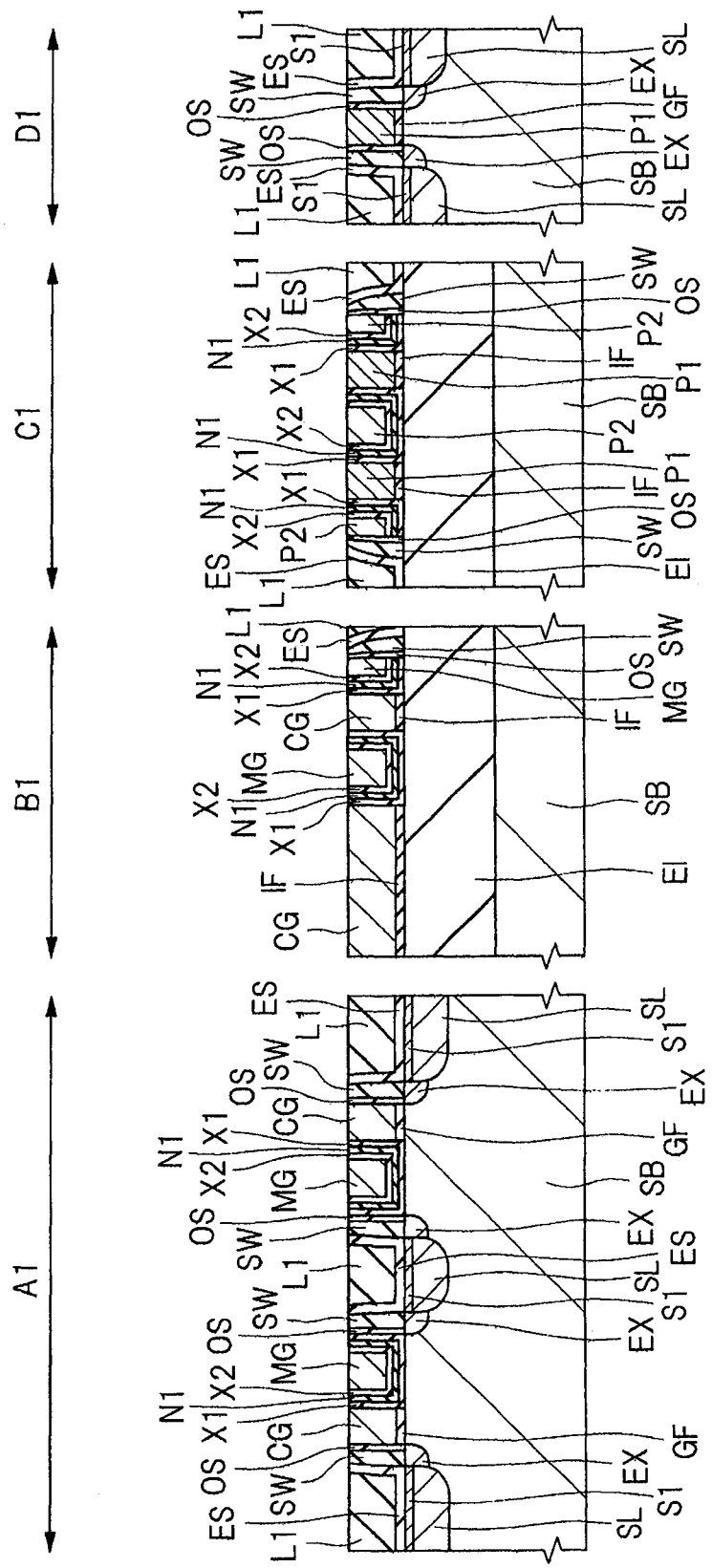
FIG. 30 is a cross-sectional view showing a method for manufacturing the semiconductor device following FIG. 29.

Then, the same steps as those described by reference to FIGS. 18 and 19 are performed, resulting in the structure shown in FIG. 30. Namely, the etching stopper film ES and the interlayer insulation film L1 are formed. Then, the interlayer insulation film L1, the etching stopper film ES, the silicon oxide films X1 and X2, the silicon nitride films N1,N2, the polysilicon films P1 and P2, the offset spacers OS, and the sidewalls SW are polished by a CMP method. As a result, the top surfaces of the polysilicon films P1 and P2 are exposed. Thus, in the MONOS memory formation region A1 and the feeding part formation region B1, there are formed the control gate electrode CG formed of the polysilicon film. P1, and the memory gate electrode MG formed of the polysilicon film P2.

In other words, in the polishing step by the CMP method, the sidewalls SW on respective inner sides of the trenches D2 and D3 immediately over the memory gate electrode MG are fully removed by polishing. Whereas, in the capacitive element formation region C1, the sidewall SW immediately over the polysilicon film P2 between the adjacent polysilicon films P1 is fully removed by polishing. As a result, respective top surfaces of the memory gate electrode MG, the control gate electrode CG, and the polysilicon films P1 and P2 are all exposed. At this step, the memory gate electrode MG formed in a sidewall shape and the polysilicon film P2 are also exposed.

A main feature of the method for manufacturing a semiconductor device of the present embodiment resides in that, as distinct from the First Embodiment, in the polishing step described by reference to FIG. 30, the silicide layer is not polished. The condition in which the silicide layer is thus not polished can be implemented by the following: the top surface of the polysilicon film P2 retreated by the steps described by reference to FIGS. 27 and 28 is covered with the sidewall SW; as a result, the silicide layer is prevented from being formed over the polysilicon film P2 in the step of FIG. 29.

Figure 29:
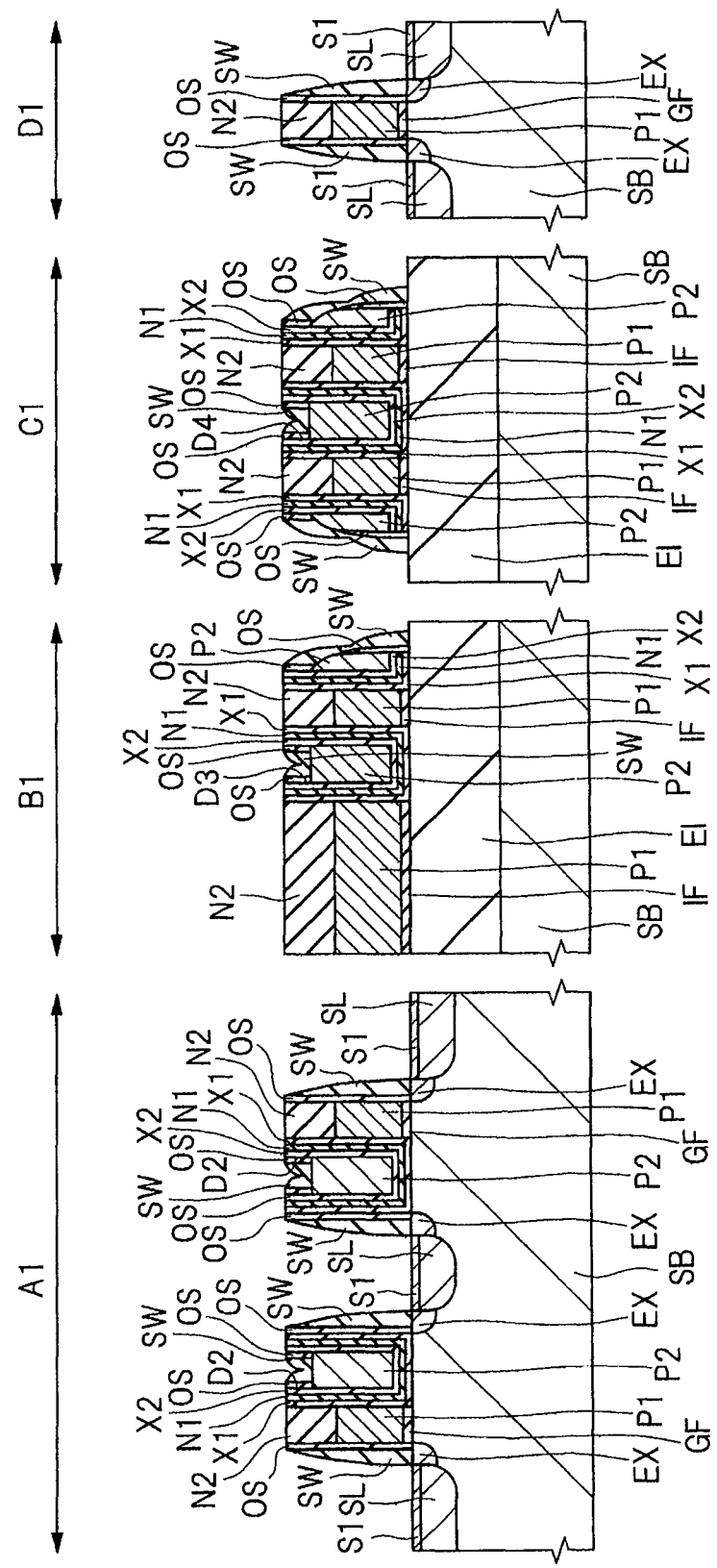
FIG. 29 is a cross-sectional view showing a method for manufacturing the semiconductor device following FIG. 28.

Herein, as described above, the silicide layer is prevented from being formed at the top surface of the polysilicon film P2 (see FIG. 29). This is for preventing the residue of the silicide layer generated by polishing the silicide layer in the polishing step from adversely affecting the subsequent manufacturing steps. Namely, the silicide layer is a conductive film including a metal, such as cobalt silicide (CoSi). The residue generated by polishing it is more likely to damage the semiconductor substrate SB, and the semiconductor layer such as the polysilicon film P1 or P2, and further more adversely affects the films formed in later deposition steps as compared with the residues generated by polishing an insulation film such as a silicon nitride film or a silicon oxide film, or a semiconductor layer. When the semiconductor layer including the semiconductor substrate SB is damaged due to the generation of the residue of the silicide layer, or insufficient deposition occurs in an interlayer insulation film or the like deposited in a later step, the reliability of the semiconductor device is unfavorably degraded.

For this reason, in the polishing step by a CMP method or the like described by reference to FIG. 30, the silicide layer is desirably not polished. Thus, in the present embodiment, the surfaces of the polysilicon films P1 and P2 are covered with insulation films such as the sidewalls SW. This prevents the silicide layer from being formed at the top surfaces of the polysilicon films P1 and P2 in the step described by reference to FIG. 29. As a result, the following situation is prevented from occurring: in a later polishing step, the silicide layer is polished, so that the residue of the silicide layer is generated over the semiconductor substrate SB.

As a result, it is possible to prevent the semiconductor layer such as the semiconductor substrate SB from being damaged. Further, it is possible to prevent the occurrence of insufficient deposition after the polishing step. Accordingly, it is possible to improve the reliability of the semiconductor device.

Figure 31:
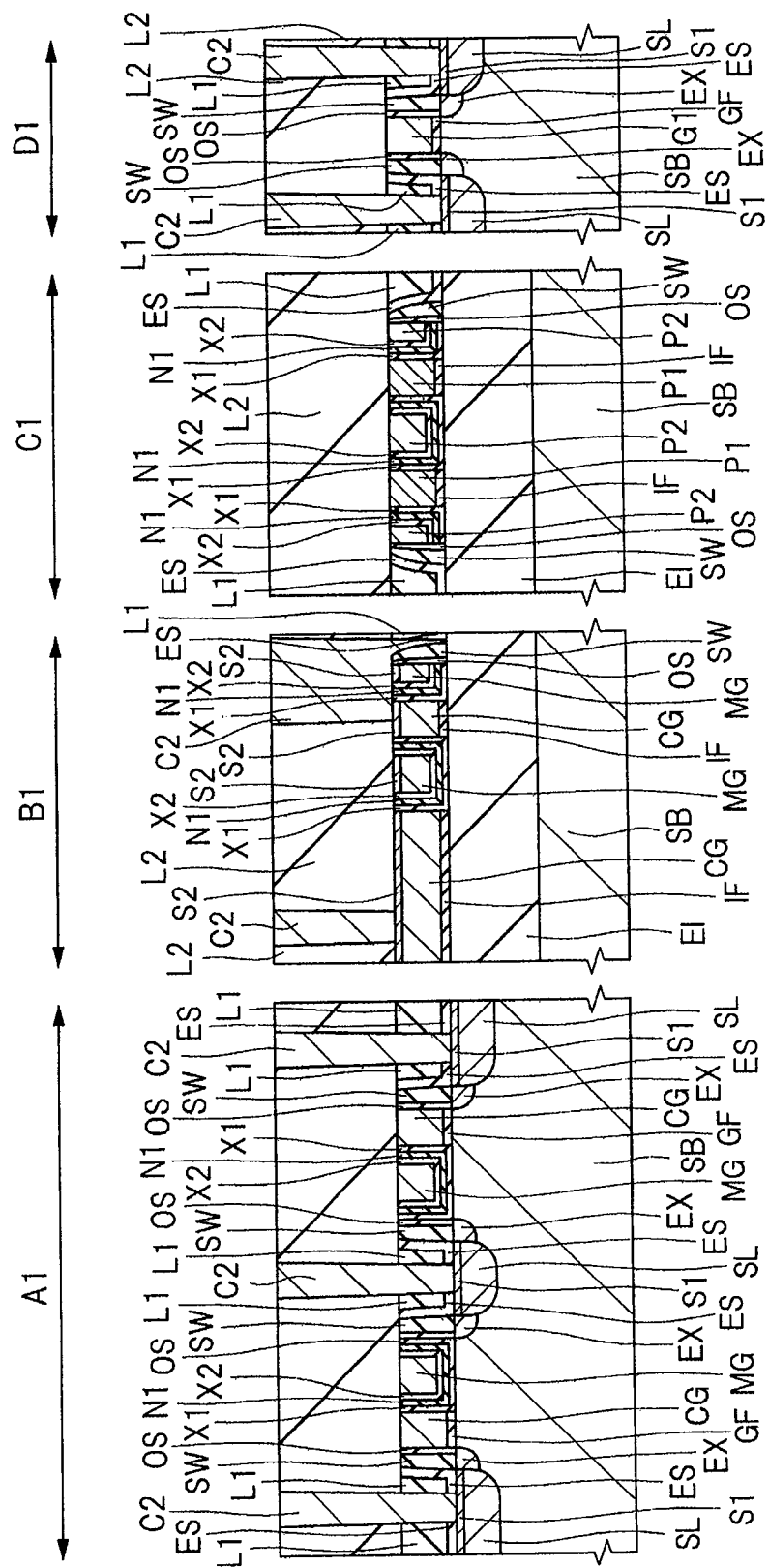
FIG. 31 is a cross-sectional view showing a method for manufacturing the semiconductor device following FIG. 30.

As the subsequent steps, the same steps as those described by reference to FIGS. 20 to 26 are performed, resulting in the completion of the semiconductor device of the present embodiment shown in FIG. 31. Namely, after forming the gate electrode G1 formed of a metal film, the silicide layer s2 is formed at the top surface of the semiconductor layer such as the feeding part. Subsequently, there are formed the interlayer insulation film L2, and the contact plug C2 penetrating the interlayer insulation film L2, and the like.

With the method for manufacturing a semiconductor device of the present embodiment, in addition to the same effects as those with the embodiments, as described above, it is possible to improve the reliability of the semiconductor device by preventing polishing of the silicide layer.

Up to this point, the invention made by the present inventors was specifically described by way of embodiments. However, the present invention is not limited to the embodiments. It is naturally understood that the present invention may be variously changed within the scope not departing from the gist thereof.

For example, in the First and Second Embodiments, a description was given to the case where n channel type MOSFETs were formed over the semiconductor substrate. However, the semiconductor element may be a p channel type MOSFET, or may be a MIS (Metal Insulator Semiconductor) type FET.

What is claimed is:

1. A method for manufacturing a semiconductor device, comprising the steps of:
    (a) providing a semiconductor substrate having a main surface, the main surface including a first region for a MISFET of a memory cell and a second region for a capacitive element;
    (b) forming a first conductor film over the main surface of the semiconductor substrate in the first and second regions via a first insulation film;
    (c) after the step (b), patterning the first conductor film to form a first gate electrode of the MISFET in the first region and a first electrode of the capacitive element in the second region, the first electrode having a first pattern and a second pattern which are opposed to each other in a sectional view;
    (d) after the step (c), forming a second insulation film so as to cover a side surface of the first gate electrode of the MISFET and side surfaces of the first and second patterns of the first electrode; and
    (e) after the step (d), forming a second conductor film over the main surface of the semiconductor substrate in the first and second regions, thereby to form a second gate electrode of the MISFET on a surface of the second insulation film and a second electrode of the capacitive element at a space between the first and the second patterns with the second insulation film in the sectional view.

2. The method for manufacturing a semiconductor device according to claim 1, further comprising the steps of:
    (f) after the step (e), removing the second conductor film over the first gate electrode in the first region and the first electrode in the second region, and leaving the second conductor film with the second insulation film so as to fill the space between the first and the second patterns in the sectional view.

3. The method for manufacturing a semiconductor device according to claim 1,
    wherein in the step (d), the second insulation film includes a first silicon oxide film, a silicon nitride film and a second silicon oxide film, and
    wherein the silicon nitride film is formed between the first silicon oxide film and the second silicon oxide film.

4. The method for manufacturing a semiconductor device according to claim 2,
    wherein in the step (b), a third insulation film is formed over the first conductor film in the first and the second region.

5. The method for manufacturing a semiconductor device according to claim 4,
    wherein in the step (f), an upper surface of the second conductor film between the first and the second patterns is higher than an upper surface of the first electrode.

* * * * *